US009202859B1

(12) United States Patent
Heinrich-Barna et al.

(10) Patent No.: US 9,202,859 B1
(45) Date of Patent: Dec. 1, 2015

(54) WELL RESISTORS AND POLYSILICON RESISTORS

(71) Applicant: Texas Instruments Incorporated, Dallas, TX (US)

(72) Inventors: Stephen Keith Heinrich-Barna, Murphy, TX (US); Douglas P. Verret, Sugarland, TX (US); Alwin J. Tsao, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/287,434

(22) Filed: May 27, 2014

(51) Int. Cl.
H01L 27/06 (2006.01)
H01L 49/02 (2006.01)
H01L 29/06 (2006.01)
H01L 21/762 (2006.01)
H01L 21/3105 (2006.01)
H01L 21/265 (2006.01)
H01L 21/324 (2006.01)
H01L 21/8234 (2006.01)

(52) U.S. Cl.
CPC ............. H01L 28/24 (2013.01); H01L 21/265 (2013.01); H01L 21/31055 (2013.01); H01L 21/324 (2013.01); H01L 21/76224 (2013.01); H01L 21/823418 (2013.01); H01L 27/0629 (2013.01); H01L 29/0649 (2013.01)

(58) Field of Classification Search
CPC ..... H01L 21/762; H01L 21/336; H01L 21/70; H01L 21/76; H01L 21/3105; H01L 21/31053; H01L 21/31055; H01L 21/76229

USPC .......... 257/E21.546, 548; 438/270, 424, 689, 438/692

See application file for complete search history.

(56) References Cited

U.S. PATENT DOCUMENTS

| | | | | |
|---|---|---|---|---|
| 6,103,592 A | * | 8/2000 | Levy et al. ..................... | 438/424 |
| 6,121,078 A | * | 9/2000 | DeBrosse et al. ............. | 438/183 |
| 6,444,581 B1 | * | 9/2002 | Buschner et al. ............. | 438/689 |
| 6,528,389 B1 | * | 3/2003 | Allman et al. ................ | 438/424 |
| 6,555,476 B1 | * | 4/2003 | Olsen et al. ................... | 438/692 |
| 2002/0061608 A1 | * | 5/2002 | Kuroda et al. ................ | 438/129 |
| 2005/0158966 A1 | * | 7/2005 | Fang et al. .................... | 438/427 |
| 2007/0155104 A1 | * | 7/2007 | Marchant et al. ............. | 438/270 |
| 2008/0220585 A1 | * | 9/2008 | Watanabe et al. ............. | 438/424 |
| 2009/0047870 A1 | * | 2/2009 | Siddiqui et al. ................ | 451/36 |
| 2011/0156149 A1 | * | 6/2011 | Wang et al. ................... | 257/368 |
| 2015/0021710 A1 | * | 1/2015 | Hsu et al. ...................... | 257/401 |

* cited by examiner

Primary Examiner — Michael Lebentritt
(74) Attorney, Agent, or Firm — Jacqueline J. Garner; Frank D. Cimino

(57) ABSTRACT

An integrated circuit containing a well resistor has STI field oxide and resistor dummy active areas in the well resistor. STI trenches are etched and filled with trench fill dielectric material. The trench fill dielectric material is removed from over the active areas by a CMP process, leaving STI field oxide in the STI trenches. Subsequently, dopants are implanted into a substrate in the well resistor area to form the well resistor. An integrated circuit containing a polysilicon resistor has STI field oxide and resistor dummy active areas in an area for the polysilicon resistor. A layer of polysilicon is formed and planarized by a CMP process. A polysilicon etch mask is formed over the CMP-planarized polysilicon layer to define the polysilicon resistor. A polysilicon etch process removes polysilicon in areas exposed by the polysilicon etch mask, leaving the polysilicon resistor.

10 Claims, 32 Drawing Sheets

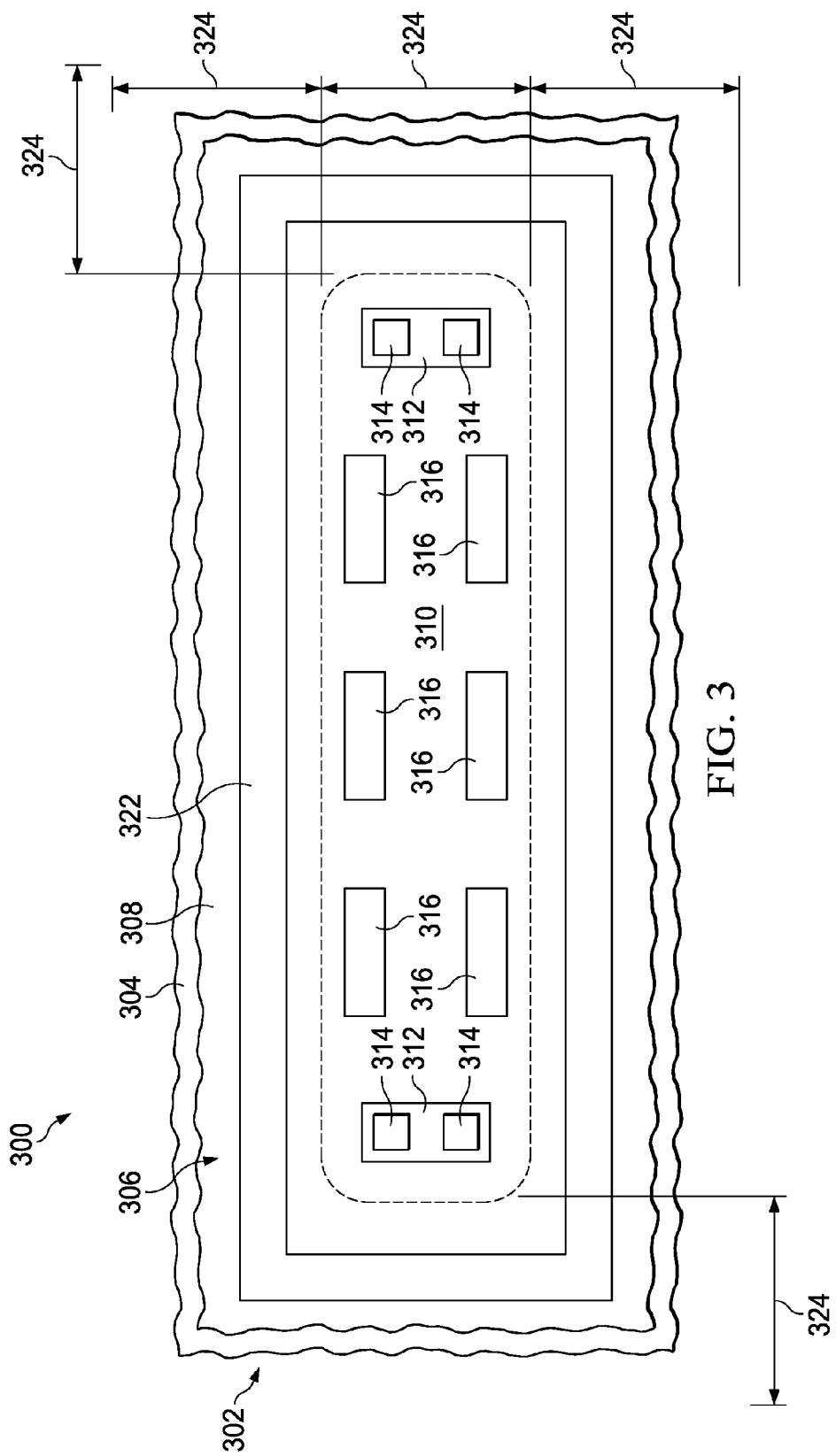

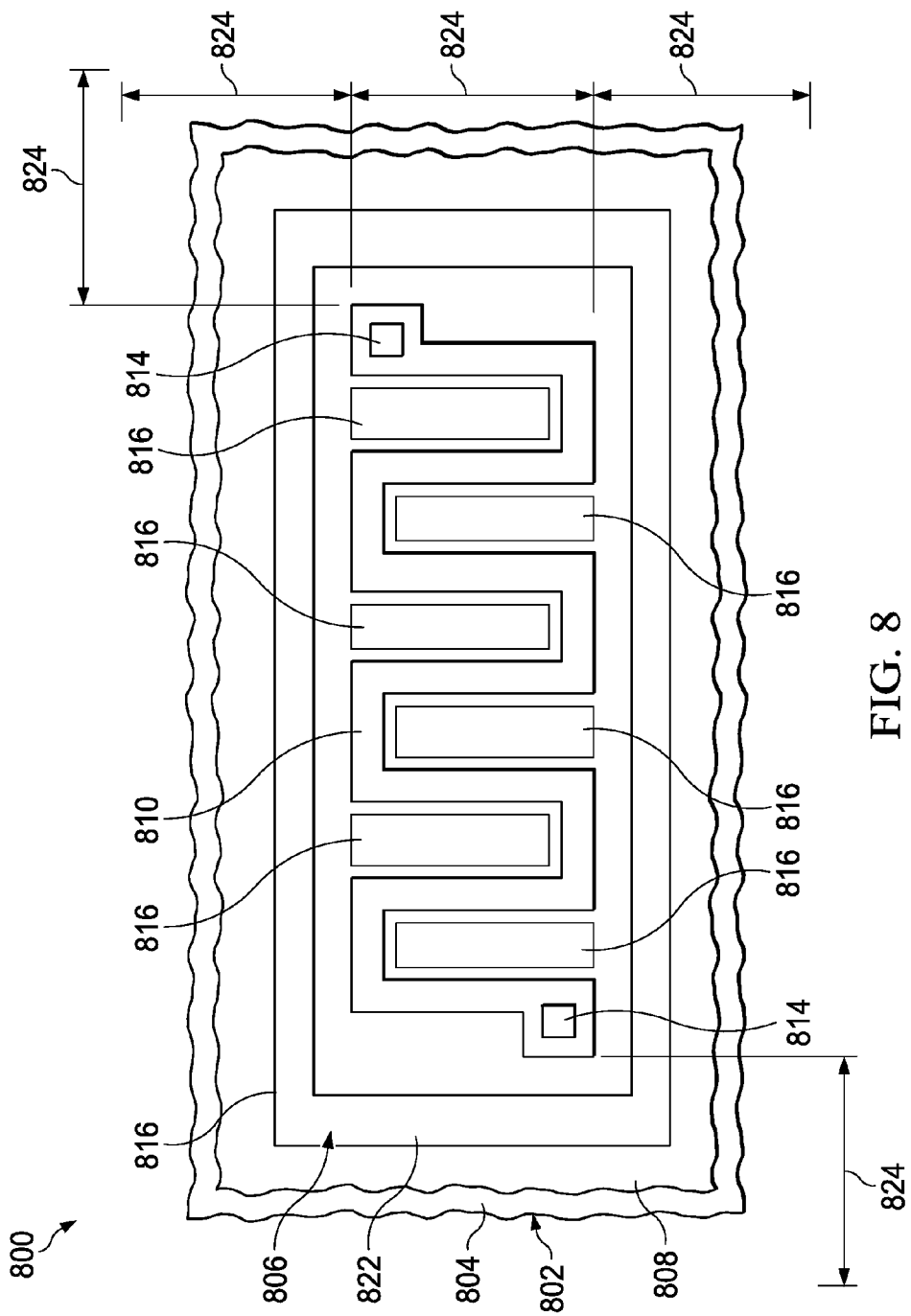

WELL RESISTORS AND POLYSILICON RESISTORS

FIELD OF THE INVENTION

This invention relates to the field of integrated circuits. More particularly, this invention relates to resistors in integrated circuits.

BACKGROUND OF THE INVENTION

An integrated circuit containing field oxide made by a shallow trench isolation (STI) process includes an oxide planarization step using a chemical mechanical polish (CMP) process. The CMP process overpolishes large areas of low active area density, such as resistor areas, producing thin field oxide in these areas with unpredictable thickness profiles. Well resistors made under overpolished field oxide have low, erratic resistance due to more implanted dopants passing through the thin field oxide. Resistors of polycrystalline silicon, referred to as polysilicon, on overpolished field oxide, in which the polysilicon has been planarized with another CMP process, tend to have high, erratic, thicknesses leading to low, variable resistance and undesired variation in temperature dependence of the resistance.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing a well resistor has resistor dummy active areas in STI field oxide in the well resistor. An STI mask is formed which covers resistor head active areas and resistor dummy active areas in an area for the well resistor. STI trenches are etched in areas exposed by the STI mask and filled with trench fill dielectric material. The trench fill dielectric material is removed from over the active areas by a CMP process, leaving STI field oxide in the STI trenches. Subsequently, dopants are implanted into a substrate in the well resistor area to form the well resistor.

An integrated circuit containing a polysilicon resistor has resistor dummy active areas in STI field oxide in an area for the polysilicon resistor. A layer of polysilicon is formed over the field oxide and planarized by a CMP process. A polysilicon etch process removes polysilicon in areas exposed by a polysilicon etch mask, leaving the polysilicon resistor.

DESCRIPTION OF THE VIEWS OF THE DRAWING

FIG. 2 and FIG. 3 are top views of example integrated circuits containing well resistors.

FIG. 8 and FIG. 9 are top views of example integrated circuits containing polysilicon resistors.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing a well resistor has resistor dummy active areas in STI field oxide in the well resistor. An STI mask is formed which covers resistor head active areas and resistor dummy active areas in an area for the well resistor. STI trenches are etched in areas exposed by the STI mask and filled with trench fill dielectric material. The trench fill dielectric material is removed from over the active areas by a CMP process, leaving STI field oxide in the STI trenches. Subsequently, dopants are implanted into a substrate in the well resistor area to form the well resistor.

An integrated circuit containing a polysilicon resistor has resistor dummy active areas in STI field oxide in an area for the polysilicon resistor. A layer of polysilicon is formed and planarized by a CMP process. A polysilicon etch process removes polysilicon in areas exposed by a polysilicon etch mask, leaving the polysilicon resistor.

Figure 1:
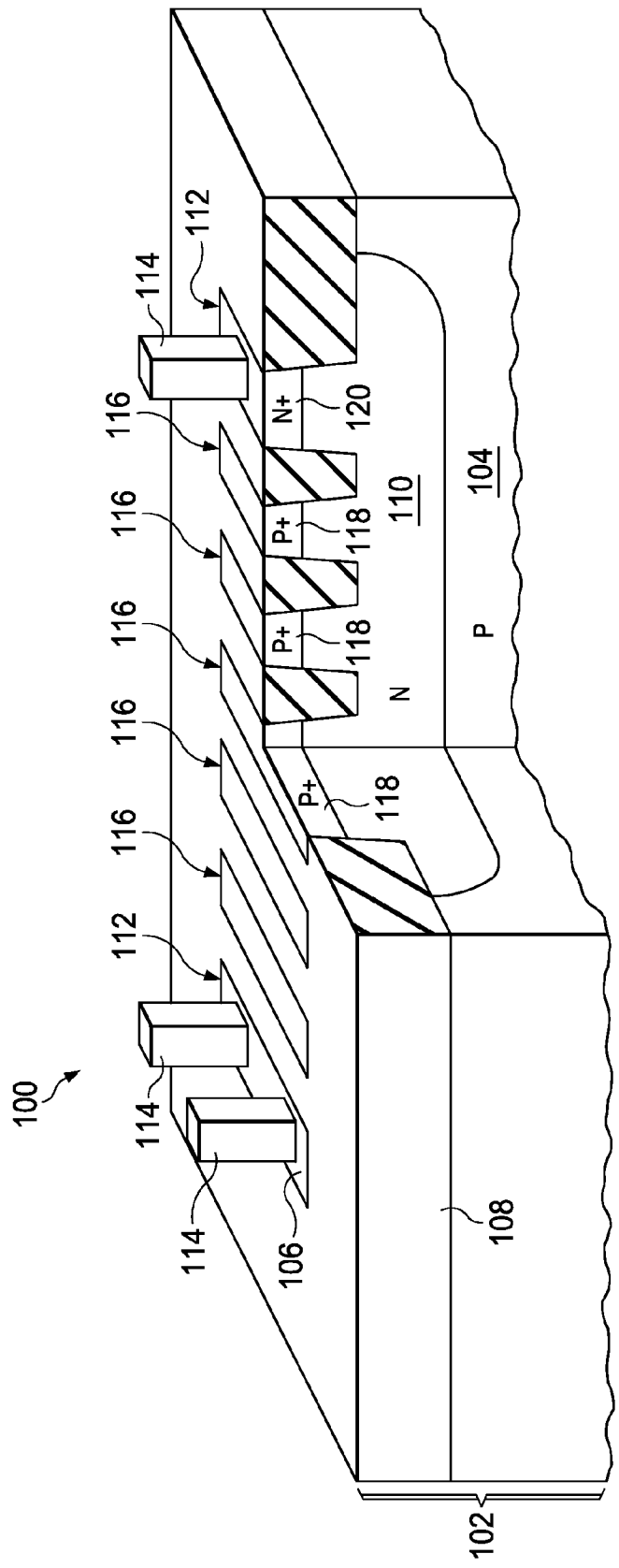
FIG. 1 is a cross section of an example integrated circuit containing a well resistor.

FIG. 1 is a cross section of an example integrated circuit containing a well resistor. The integrated circuit 100 is formed on a substrate 102 which includes semiconductor material 104 extending to a top surface 106 of the substrate 102. The instant example will be described for p-type semiconductor material 104. Field oxide 108 formed by an STI process is disposed at the top surface 106 of the substrate 102. An n-type well resistor 110 is disposed in the semiconductor material 104 of the substrate 102 under the field oxide 108. An average doping density in the well resistor 110 may be, for example, $1 \times 10^{17}$ cm$^{-3}$ to $5 \times 10^{18}$ cm$^{-3}$. Resistor head active areas 112 are disposed through the field oxide 108 proximate to ends of the well resistor 110. Contacts 114 are formed to make electrical connections to the resistor head active areas 112, possibly through layers of metal silicide, not shown in FIG. 1. The field oxide 108 is formed so that resistor dummy active areas 116 are disposed through the field oxide 108 in an area for the well resistor 110. The resistor dummy active areas 116 are free of electrical connections above the substrate 102. In the instant example, the resistor dummy active areas are configured as a plurality of rectangles such that each rectangle extends from proximate to one side of the well resistor to proximate to an opposite side of the well resistor. A density of the resistor dummy active areas 116 is 10 percent to 80 percent. Heavily doped dummy diffused regions 118 may optionally be formed in the resistor dummy active areas 116. An average doping density in the dummy diffused regions 118 is at least ten times the average doping density in the well resistor 110. In the instant example, the dummy diffused regions 118 are p-type, that is, the dummy diffused regions 118 have an opposite conductivity type from the well resistor 110. Heavily doped resistor head contact regions 120 may be formed in the resistor head active areas 112 having the same conductivity type as the well resistor 110. Forming the resistor dummy active areas 116 in the area for the well resistor 110 with a density of 10 percent to 80 percent may prevent overpolishing the field oxide 108 during the STI process, advantageously providing a desired thickness of the field oxide, which thus provides a desired resistance for the well resistor 110. In one version of the instant example, the density of the resistor dummy active areas 116 is 20 percent to 50 percent, advantageously providing a thickness of the field oxide 108 closer to a desired thickness. In a further version, the density of the resistor dummy active areas 116 is 30 percent to 35 percent, advantageously narrowing the range for the thickness of the field oxide 108 even further. Resistances of instances of the well resistor 110 may be tuned by adjusting lateral dimensions and spacings of the resistor dummy active areas 116. A p-type well resistor in an n-type substrate may be formed according to the instant example with appropriate changes in dopants and conductivity types. Further, a p-type well resistor may be formed in a p-type substrate by forming an isolating n-type structure, such as a buried layer or a deep well, under the p-type well resistor. An n-type well resistor may analogously be formed in an n-type substrate using a p-type isolating structure.

Figure 2:
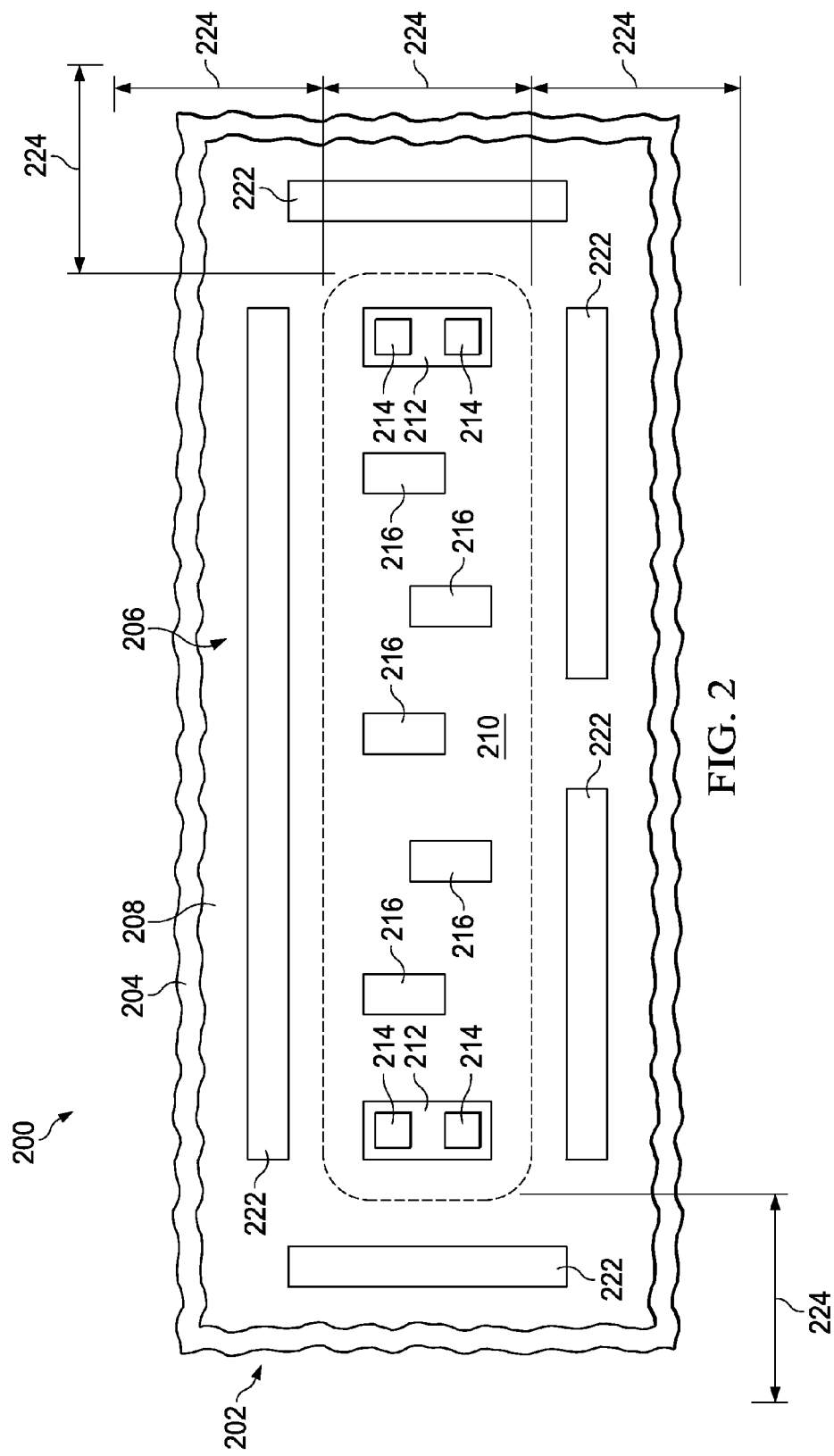

FIG. 2 and FIG. 3 are top views of example integrated circuits containing well resistors. Referring to FIG. 2, the integrated circuit 200 is formed on a substrate 202 which includes semiconductor material 204 extending to a top surface 206 of the substrate 202. Field oxide 208 formed by an STI process is disposed at the top surface 206 of the substrate 202. A well resistor 210 is disposed in the semiconductor material 204 under the field oxide 208. Resistor head active areas 212 are disposed through the field oxide 208 proximate to ends of the well resistor 210. Contacts 214 are formed to make electrical connections to the resistor head active areas 212. The field oxide 208 is formed so that resistor dummy active areas 216 are disposed through the field oxide 208 in an area for the well resistor 210. In the instant example, the resistor dummy active areas 216 may be configured to minimize an effect on a resistance of the well resistor 210 while maintaining a desired density of the resistor dummy active areas 216 to provide a desired thickness of the field oxide 208. Optional surrounding dummy active areas 222 may be disposed through the field oxide 208 on all sides of, and outside of, the area for the well resistor 210. The surrounding dummy active areas 222, if present, are within a width 224 of the well resistor 210. The surrounding dummy active areas 222 may be segmented, as shown in FIG. 2. Forming the surrounding dummy active areas 222 within the width 224 of the well resistor 210 may advantageously provide a tighter process range for the thickness of the field oxide 208.

Referring to FIG. 3, the integrated circuit 300 is formed on a substrate 302 which includes semiconductor material 304 extending to a top surface 306 of the substrate 302. Field oxide 308 formed by an STI process is disposed at the top surface 306 of the substrate 302. A well resistor 310 is disposed in the semiconductor material 304 under the field oxide 308. Resistor head active areas 312 are disposed through the field oxide 308 proximate to ends of the well resistor 310. Contacts 314 are formed to make electrical connections to the resistor head active areas 312. The field oxide is formed so that resistor dummy active areas 316 are disposed through the field oxide 308 in an area for the well resistor 310. In the instant example, the resistor dummy active areas 316 may be configured parallel to current flow in the well resistor 310 to provide greater tuning capability on a resistance of the well resistor 310 while maintaining a desired density of the resistor dummy active areas 316 to provide a desired thickness of the field oxide 308. An optional surrounding dummy active area 322 may be disposed through the field oxide 308 continuously surrounding the area for the well resistor 310. The surrounding dummy active area 322, if present, is within a width 324 of the well resistor 310. Forming the surrounding dummy active area 322 so as to continuously surround the well resistor 310 within the width 324 of the well resistor 310 may advantageously provide a tighter process range for the thickness of the field oxide 308 while reducing the density of the resistor dummy active areas 316. Reducing the density of the resistor dummy active areas 316 may be desirable for reducing an overall area of the well resistor 310.

Figure 4A:
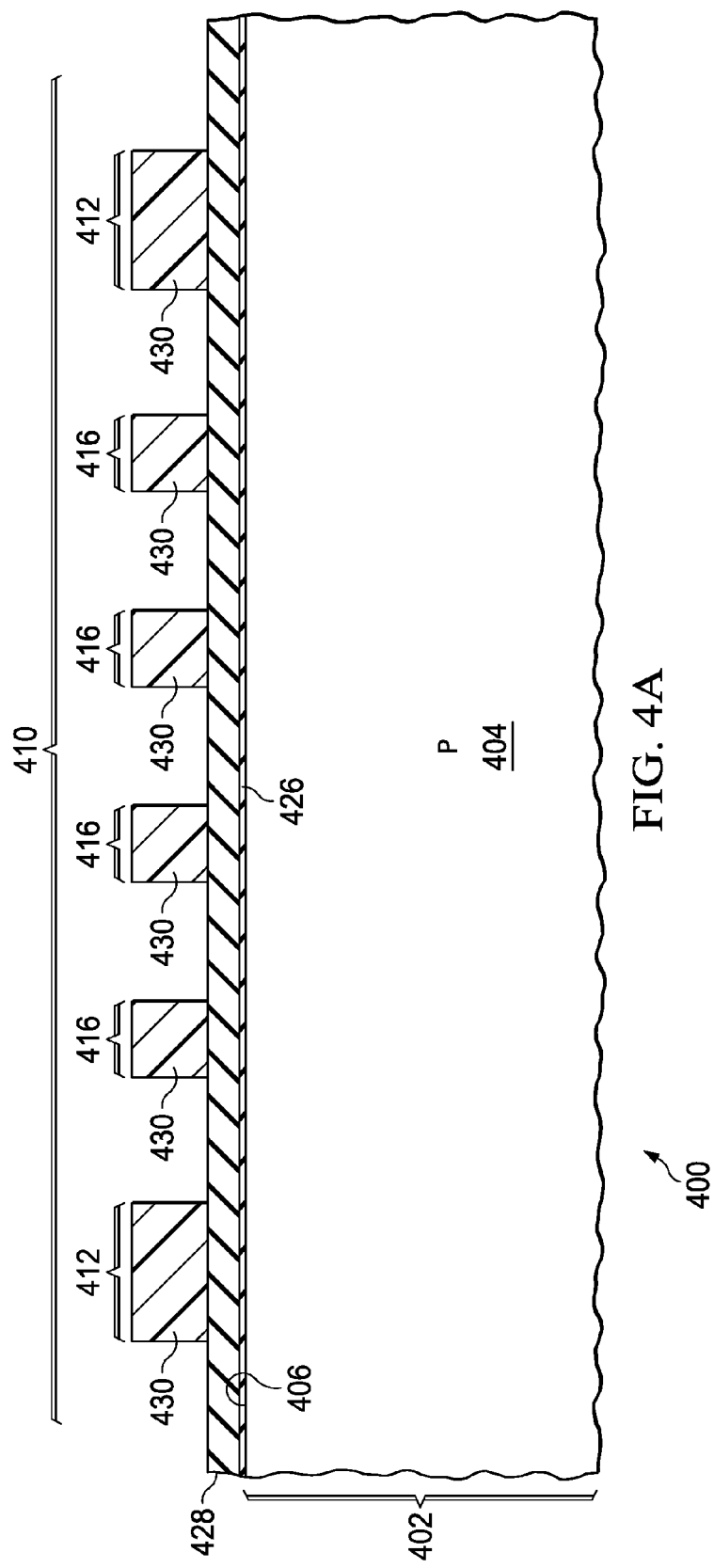
FIG. 4A through FIG. 4L are cross sections of an example integrated circuit containing a well resistor, depicted in successive stages of fabrication.

FIG. 4A through FIG. 4L are cross sections of an example integrated circuit containing a well resistor, depicted in successive stages of fabrication. Referring to FIG. 4A, the integrated circuit 400 is formed on a substrate 402 which includes semiconductor material 404 extending to a top surface 406 of the substrate 402. In the instant example, the semiconductor material 404 is p-type. A pad oxide layer 426 of silicon dioxide, 5 nanometers to 25 nanometers thick, is formed over the top surface 406 of the substrate 402, by thermal oxidation of silicon in the semiconductor material 404 or by deposition, such as by a plasma enhanced chemical vapor deposition (PECVD) process using tetraethyl orthosilicate, also known as tetraethoxysilane (TEOS). A CMP stop layer 428 of silicon nitride 50 nanometers to 200 nanometers thick, is formed over the pad oxide layer 426, for example by a low pressure chemical vapor deposition (LPCVD) process using silane or dichlorosilane and ammonia at 700° C. An STI mask 430 is formed over the CMP stop layer 428 so as to cover areas for active areas in the integrated circuit 400, including areas for resistor head active areas 412 and areas for resistor dummy active areas 416 in an area for the well resistor 410. The STI mask 430 may include photoresist, formed using a photolithographic process, and may optionally include anti-reflection layers and/or hardmask layers.

Figure 4B:
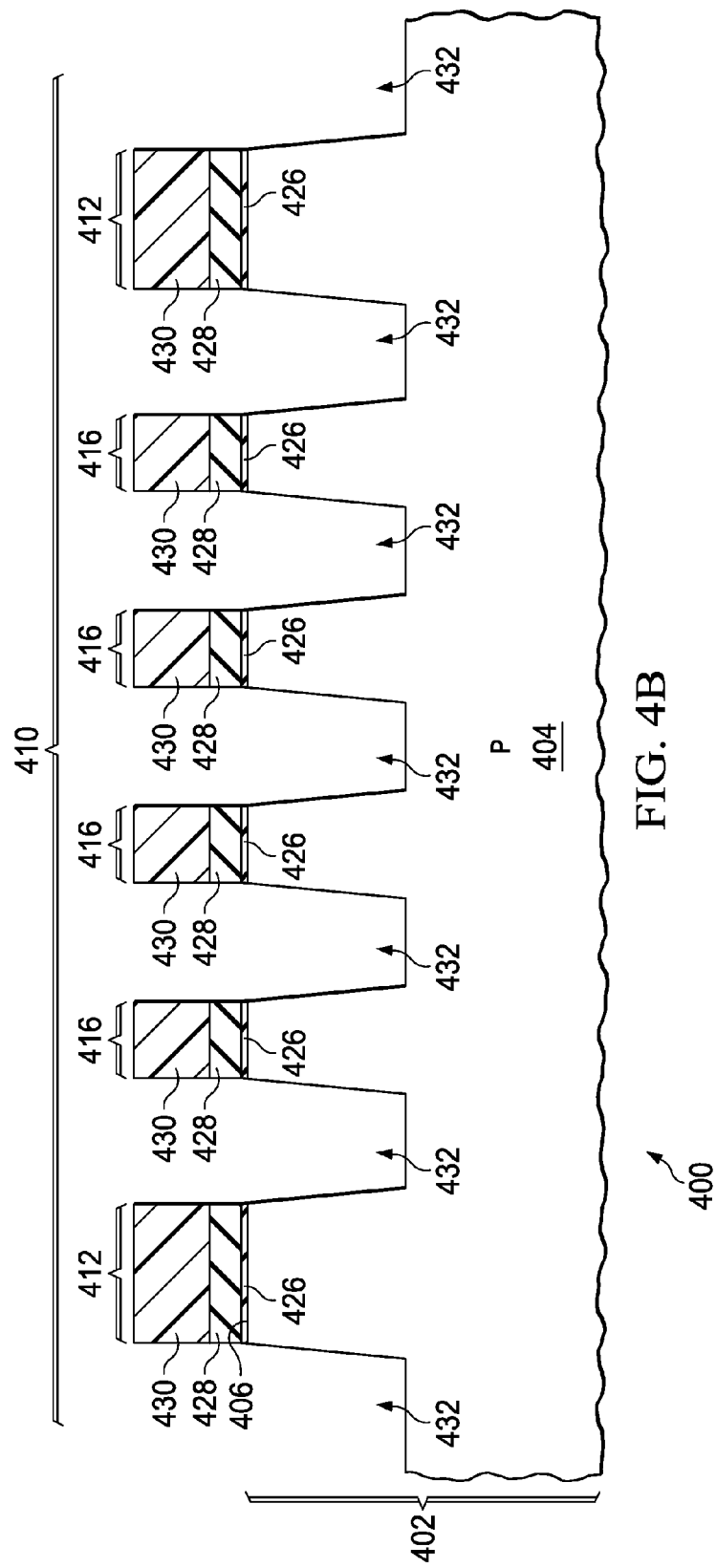

Referring to FIG. 4B, an STI trench etch process removes the CMP stop layer 428 and the pad oxide layer 426 in areas exposed by the STI mask 430 and etches into the semiconductor material 404 to form STI trenches 432, 250 nanometers to 500 nanometers deep, in areas exposed by the STI mask 430. The STI mask 430 is subsequently removed, for example by an ash process followed by a wet clean step using an aqueous mixture of sulfuric acid and hydrogen peroxide. A layer of silicon dioxide, not shown in FIG. 4B, may be formed on sidewalls of the STI trenches 432 by thermal oxidation of silicon in the semiconductor material 404 after the STI mask 430 is removed.

Figure 4C:
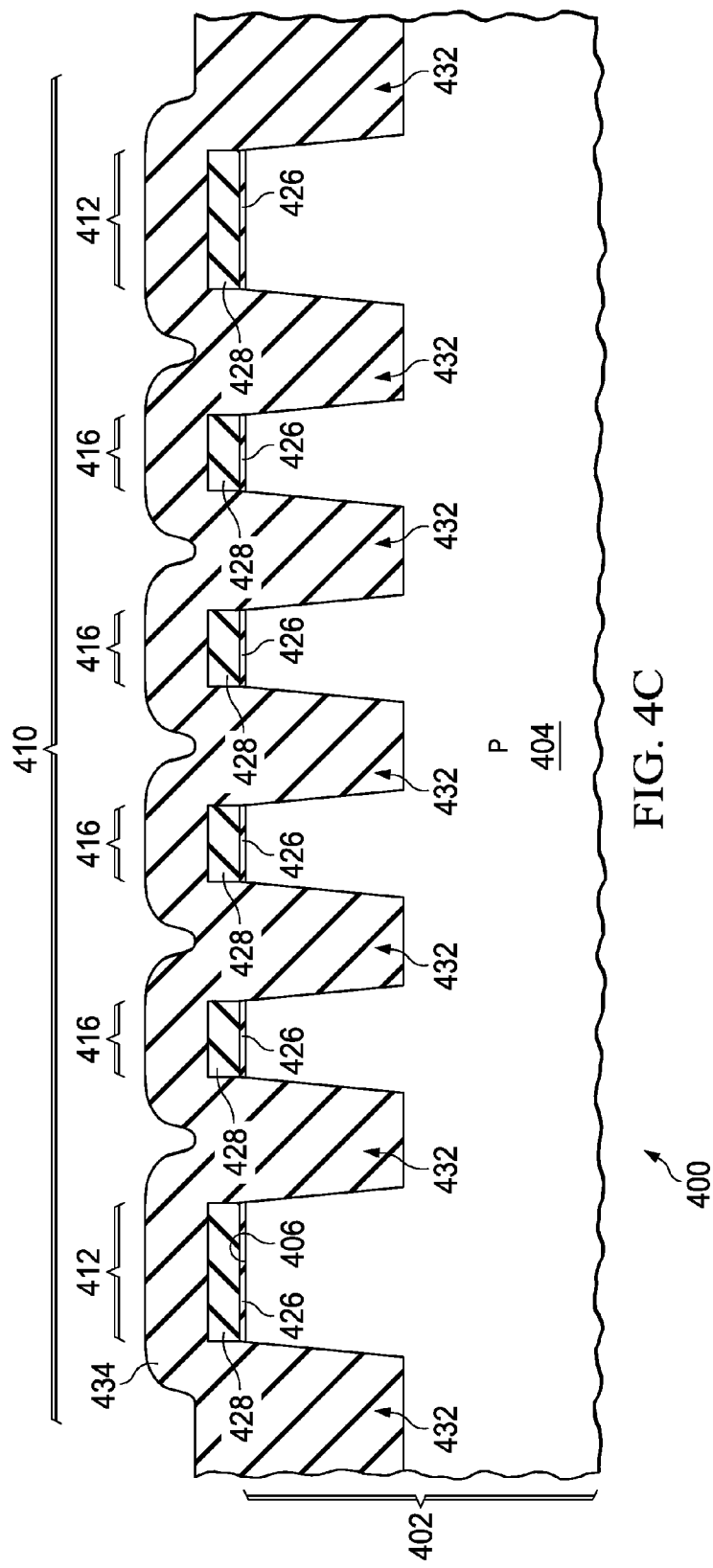

Referring to FIG. 4C, a layer of trench fill dielectric material 434 is formed in the STI trenches 432 and over the CMP stop layer 428 over the areas for resistor head active areas 412 and areas for resistor dummy active areas 416. The trench fill dielectric material 434 fills the STI trenches 432. The trench fill dielectric material 434 may include primarily silicon dioxide, and may include a layer of silicon nitride or silicon oxy-nitride. The trench fill dielectric material 434 may be formed in a single layer or in several layers. Blanket etch processes may be performed between formation of the several layers to reduce a thickness of the trench fill dielectric material 434 over the CMP stop layer 428. The trench fill dielectric material 434 may be formed by a variety of processes, for example an atmospheric pressure chemical vapor deposition (APCVD) process with silane and oxygen, at 450° C., a sub-atmospheric chemical vapor deposition (SACVD) process with dichlorosilane and oxygen, at 500° C., a high density plasma (HDP) process, or an ozone based thermal chemical vapor deposition (CVD) process, also known as a high aspect ratio process (HARP). The trench fill dielectric material 434 may be subsequently densified with a thermal anneal at 900° C. to 1100° C. for at least 30 minutes in a nitrogen or oxygen ambient.

Figure 4D:
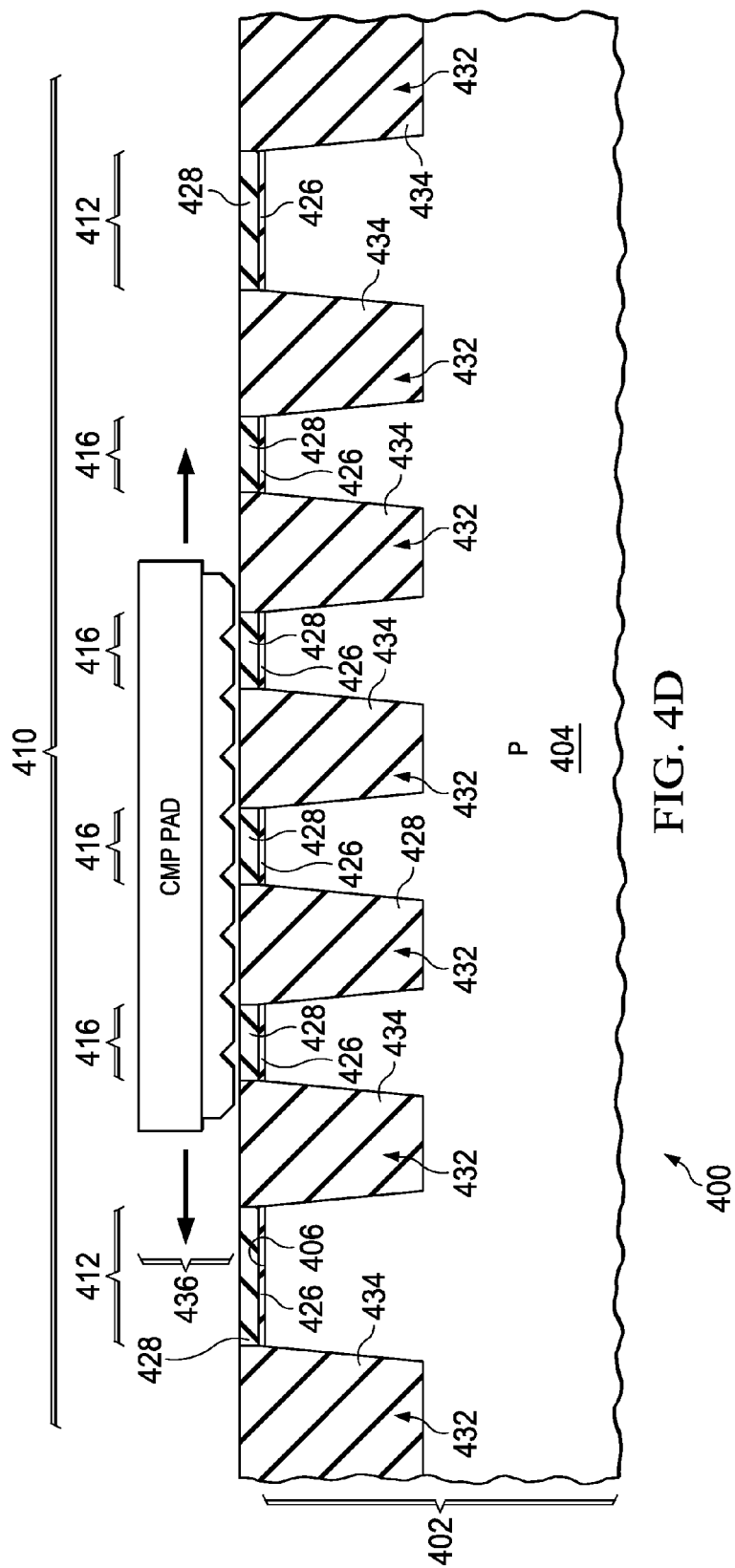

Referring to FIG. 4D, the trench fill dielectric material 434 is planarized down to the CMP stop layer 428 by a CMP process 436, depicted schematically in FIG. 4D by a CMP Pad 436. The trench fill dielectric material 434 over the resistor head active areas 412 and the resistor dummy active areas 416 provide sufficient resistance to the CMP Pad 436 so as to advantageously prevent overpolishing of the trench fill dielectric material 434 in the area for the well resistor 410. In the instant example, all the trench fill dielectric material 434 over the CMP stop layer 428 in the area for the well resistor 410 is removed by the CMP process 436 and none of the semiconductor material 404 is removed from the resistor head active areas 412 and the resistor dummy active areas 416 by the CMP process 436.

Figure 4E:
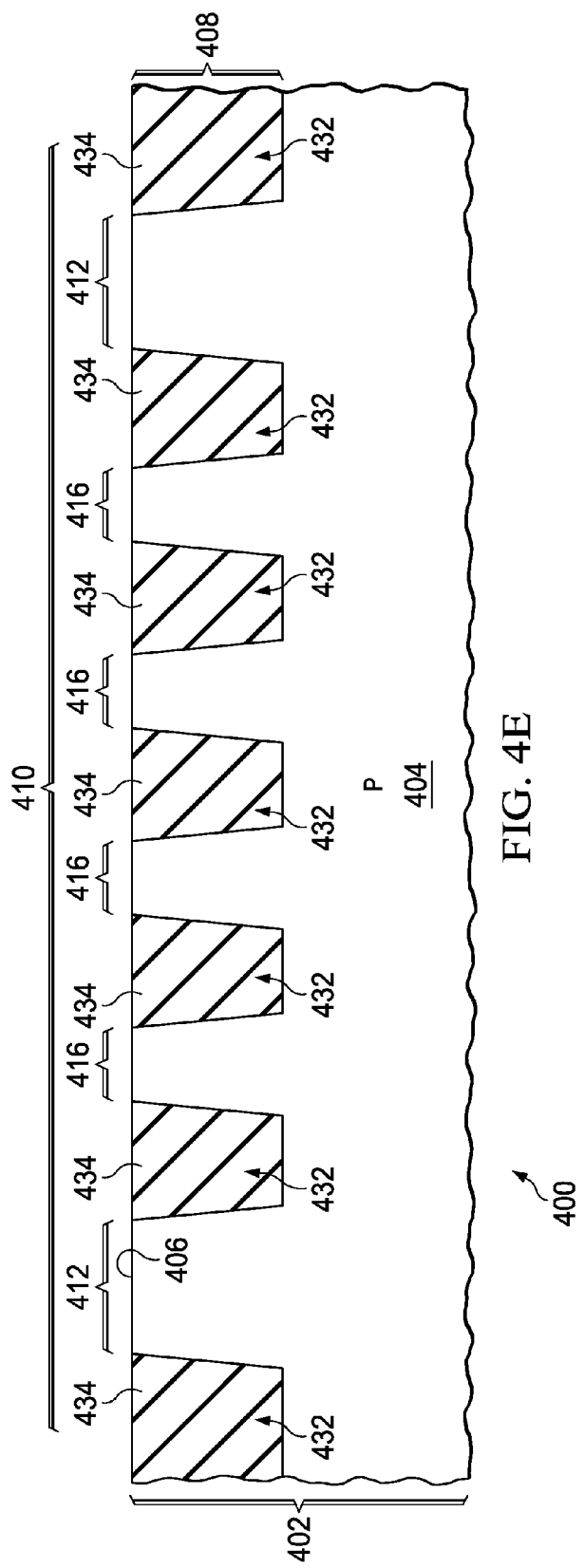

Referring to FIG. 4E, a remaining portion of the CMP stop layer 428 of FIG. 4D is removed, leaving the trench fill dielectric material 434 in the STI trenches 432 to provide field oxide 408 for the integrated circuit 400. The pad oxide layer 426 may optionally be removed as well, as depicted in FIG. 4E. The CMP stop layer 428 may be removed by an aqueous solution of phosphoric acid at 155° C. The pad oxide layer 426 may be removed by a dilute buffered aqueous solution of hydrofluoric acid.

Figure 4F:
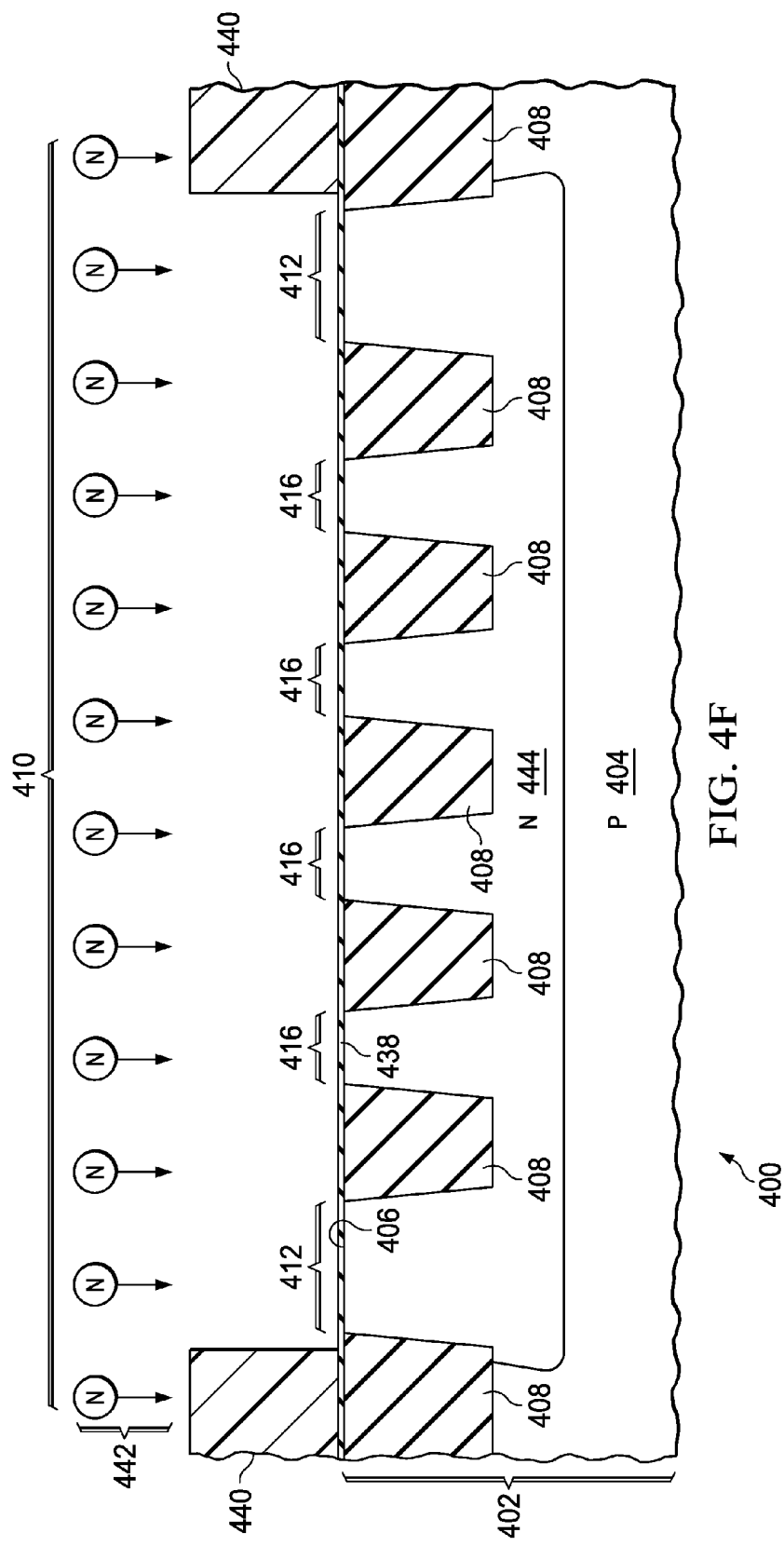

Referring to FIG. 4F, a second layer of pad oxide 438 of silicon dioxide, 5 nanometers to 15 nanometers thick, may be formed over the substrate 402. The second layer of pad oxide 438 may be formed by depositing a blanket layer of silicon dioxide over the substrate 402 and the field oxide 408, as shown in FIG. 4F, by a PECVD process. Alternately, the second layer of pad oxide 438 may be formed over the active areas of the integrated circuit 400 including the resistor head active areas 412 and the resistor dummy active areas 416 by thermal oxidation of silicon in the semiconductor material 404 at the top surface 406 of the substrate 402. A well implant mask 440 is formed over the substrate 402 and field oxide 408 so as to expose the area for the well resistor 410. The well implant mask 440 may expose areas for other n-type wells in the integrated circuit 400, for example n-type wells under p-channel metal oxide semiconductor (PMOS) transistors, advantageously reducing fabrication cost and fabrication complexity of the integrated circuit 400. N-type dopants 442 such as phosphorus are implanted into the substrate 402 in areas exposed by the well implant mask 440 to form a well implanted region 444 in the semiconductor material 404 of the substrate 102. The n-type dopants 442 may be implanted at a dose of $1\times10^{13}$ cm$^{-2}$ to $1\times10^{14}$ cm$^{-2}$ and an energy of 400 keV to 700 keV. The well implanted region 444 extends under the field oxide 408. The well implant mask 440 is subsequently removed, for example as described in reference to the STI mask 430 of FIG. 4B.

Figure 4G:
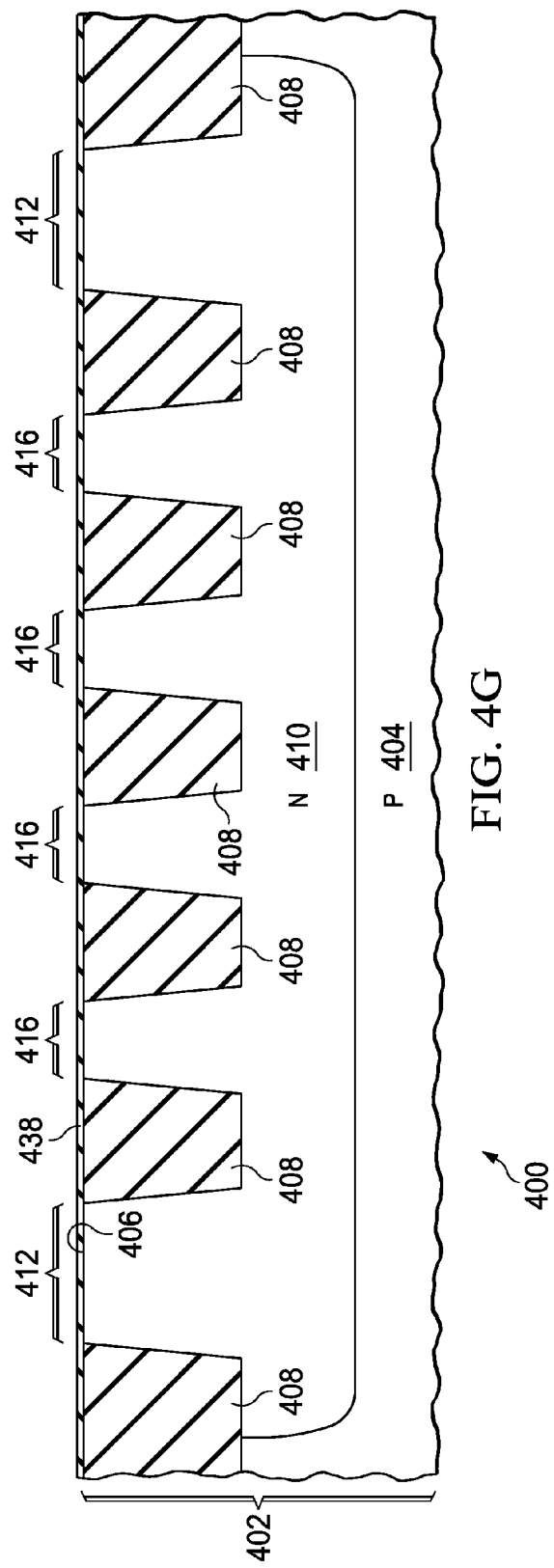

Referring to FIG. 4G, a well anneal process is performed which diffuses and activates the implanted n-type dopants 442 in the well implanted region 444 of FIG. 4F to form the well resistor 410. In one version of the instant example, the well anneal process may include a furnace anneal at 800° C. to 900° C. for 30 minutes to 2 hours. In an alternate version, the well anneal may include a rapid thermal processor anneal at 1025° C. to 1060° C. for 20 seconds to 60 seconds. A sheet resistance of the well resistor 410 may be 100 ohms/square to 1000 ohms/square.

Figure 4H:
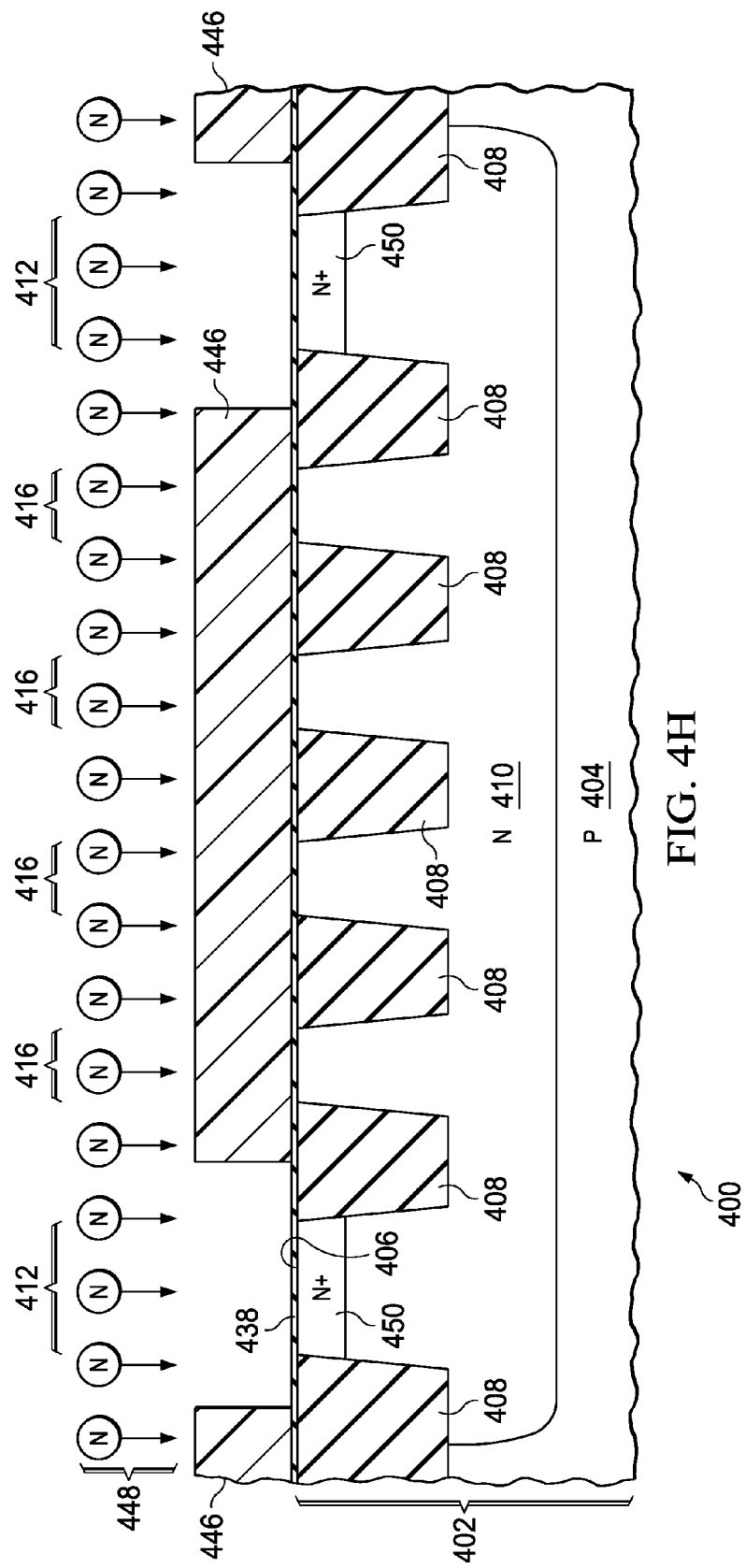

Referring to FIG. 4H, a contact implant mask 446 is formed over an existing top surface of the integrated circuit 400 so as to expose the resistor head active areas 412. In the instant example, the contact implant mask 446 covers the resistor dummy active areas 416. The contact implant mask 446 may also expose areas for n-channel source/drain (NSD) region in n-channel metal oxide semiconductor (NMOS) transistors in the integrated circuit 400, advantageously reducing fabrication cost and fabrication complexity of the integrated circuit 400. N-type dopants 448 such as phosphorus and/or arsenic are implanted into the resistor head active areas 412 to form contact implanted regions 450 which extend from the top surface 406 of the substrate 402 to a depth of 100 nanometers to 300 nanometers. The contact implanted regions 450 do not extend as deep as the field oxide 408. The n-type dopants 448 may be implanted at a dose of $1\times10^{15}$ cm$^{-2}$ to $5\times10^{16}$ cm$^{-2}$ and an energy of 30 keV to 80 keV. The contact implant mask 446 is subsequently removed, for example as described in reference to the STI mask 430 of FIG. 4B.

Figure 4I:
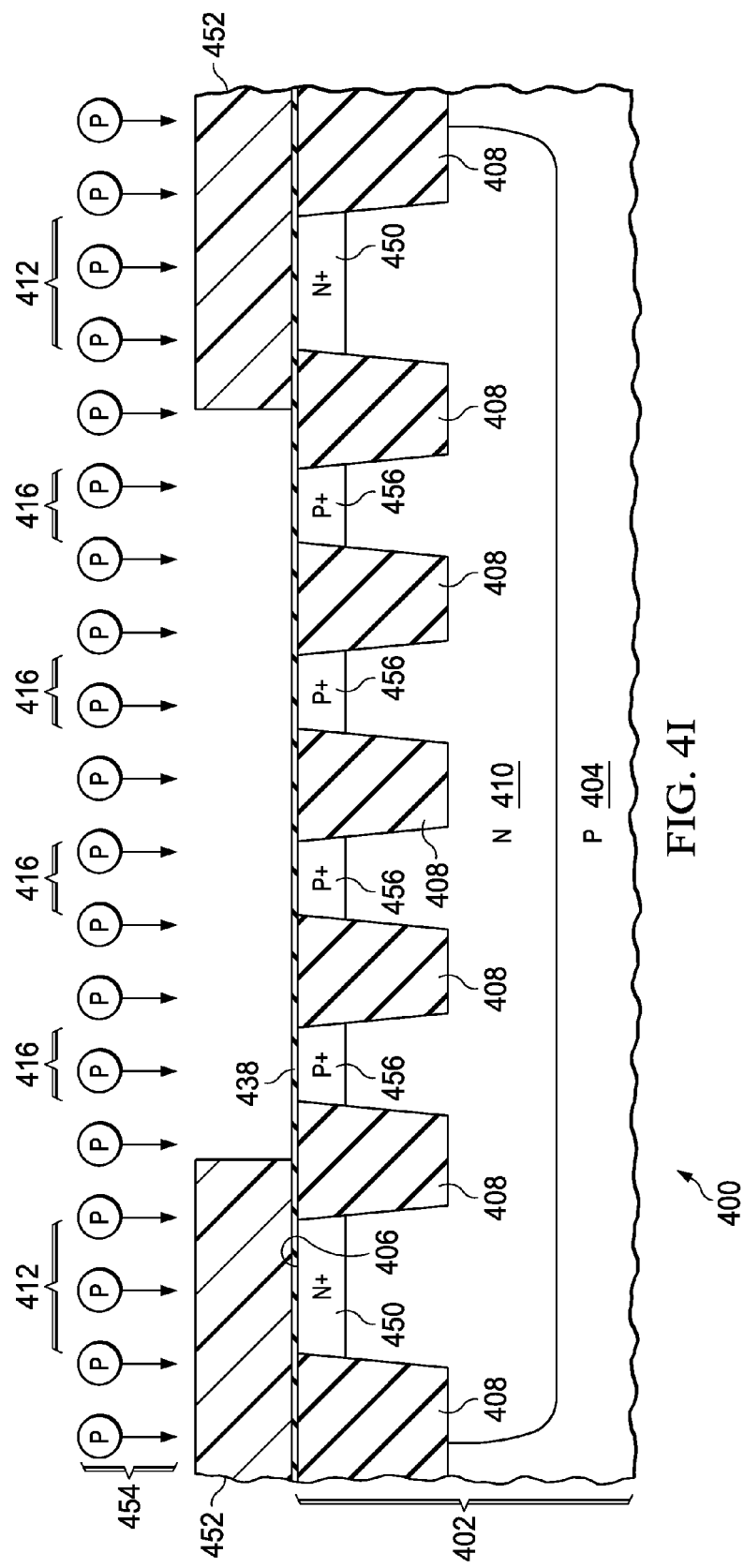

Referring to FIG. 4I, a dummy region implant mask 452 is formed over an existing top surface of the integrated circuit 400 so as to expose the resistor dummy active areas 416 and to cover the resistor head active areas 412. The dummy region implant mask 452 may also expose areas for p-channel source/drain (PSD) region in PMOS transistors in the integrated circuit 400, advantageously reducing fabrication cost and fabrication complexity of the integrated circuit 400. P-type dopants 454 such as boron are implanted into the resistor dummy active areas 416 to form dummy implanted regions 456 which extend from the top surface 406 of the substrate 402 to a depth of 100 nanometers to 300 nanometers. The dummy implanted regions 456 do not extend as deep as the field oxide 408. The p-type dopants 454 may be implanted at a dose of $1\times10^{15}$ cm$^{-2}$ to $5\times10^{16}$ cm$^{-2}$ and an energy of 5 keV to 15 keV. The dummy region implant mask 452 is subsequently removed, for example as described in reference to the STI mask 430 of FIG. 4B.

Figure 4J:
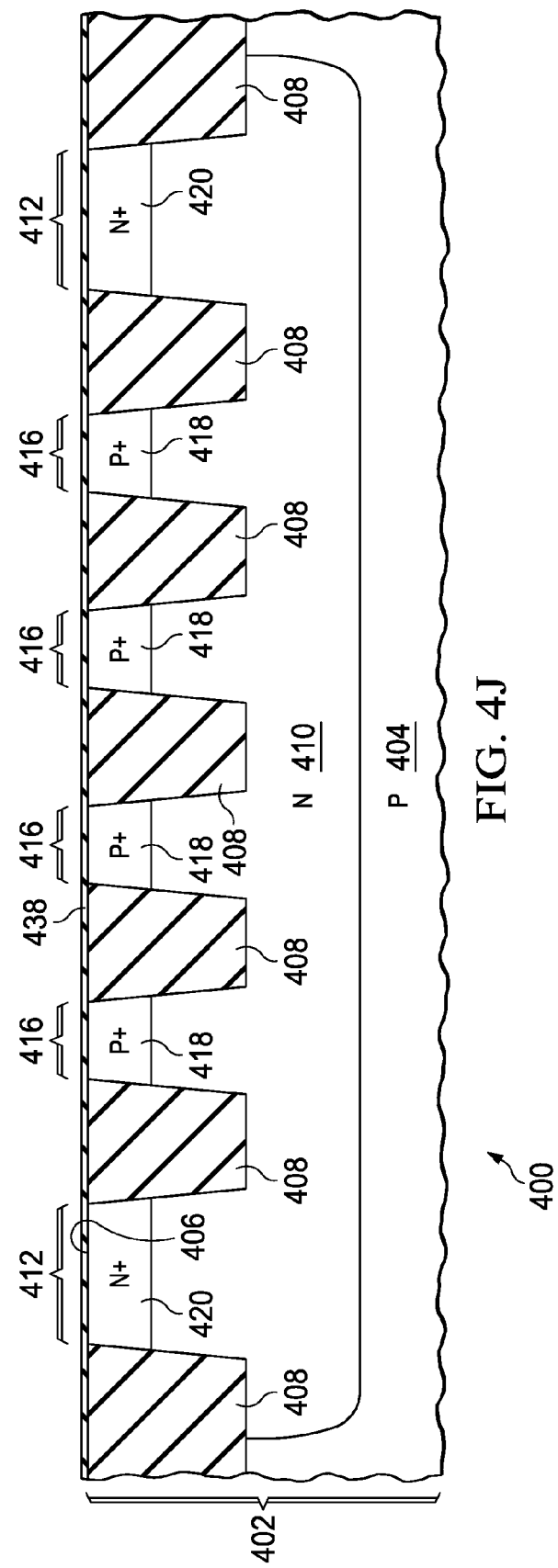

Referring to FIG. 4J, an anneal operation is performed which activates the implanted n-type dopants 448 of FIG. 4H in the contact implanted regions 450 to form n-type resistor head contact regions 420 in the resistor head active areas 412, and activates the implanted p-type dopants 454 of FIG. 4I in the dummy implanted regions 456 to form p-type dummy diffused regions 418 in the resistor dummy active areas 416. The anneal operation may include a rapid thermal processor anneal at 985° C. to 1025° C. for 10 seconds to 30 seconds. Neither the dummy diffused regions 418 nor the resistor head contact regions 420 extend as deep as the field oxide 408.

Figure 4K:
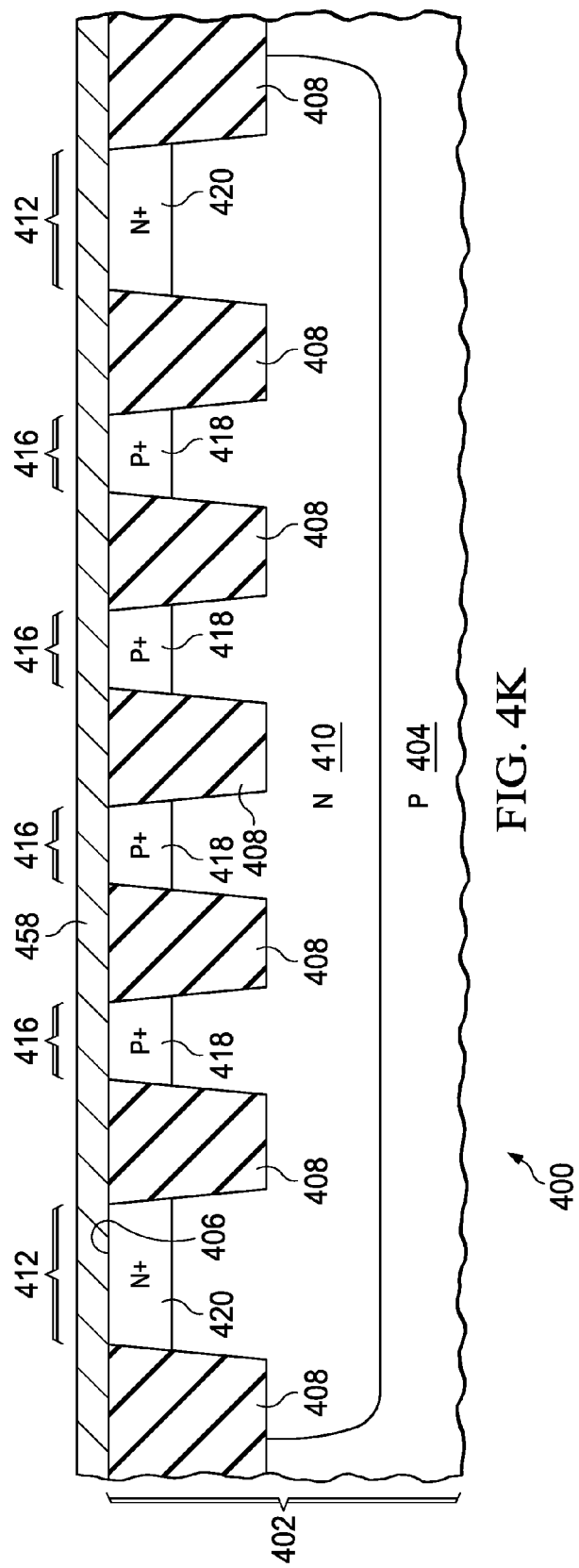

Referring to FIG. 4K, dielectric material, such as the second layer of pad oxide 438 of FIG. 4J, on the top surface 406 of the resistor head active areas 412, and possibly on the resistor dummy active areas 416, is removed, for example by a dilute buffered aqueous solution of hydrofluoric acid, followed by a sequential dry etch such as a Siconi etch. A layer of refractory metal 458 is formed on the resistor head active areas 412, and possibly on the resistor dummy active areas 416 if exposed. The layer of refractory metal 458 may include, for example, platinum, titanium, cobalt, nickel or molybdenum, and may be 5 nanometers to 50 nanometers thick, and may optionally include a cap layer. The layer of refractory metal 458 may be formed by sputtering or by a metal organic chemical vapor deposition (MOCVD) process.

Figure 4L:
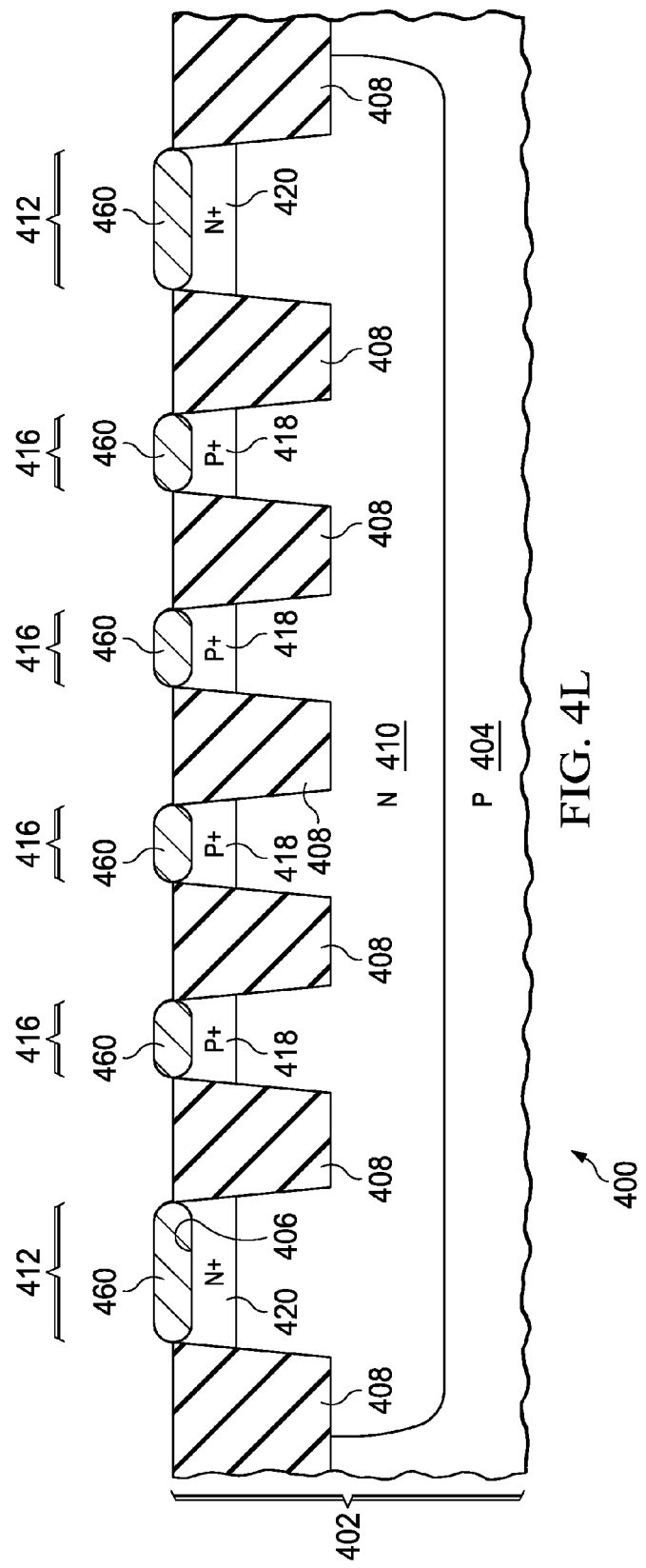

Referring to FIG. 4L, the substrate 402 is heated so that the refractory metal in the layer of refractory metal 458 of FIG. 4K reacts with silicon in the resistor head active areas 412 and the resistor dummy active areas 416 at the top surface 406 of the substrate 402 to form metal silicide layers 460 at tops of the resistor head active areas 412, and the resistor dummy active areas 416. The temperature required to form the metal silicide layers 460 depends on the specific refractory metal in the layer of refractory metal 458. Unreacted refractory metal in the layer of refractory metal 458 is subsequently removed, for example by a wet etch process using a mixture of sulfuric acid and hydrogen peroxide. The metal silicide layers 460 and the resistor head contact regions 420 advantageously provide low resistance connections to the well resistor 410. Forming the metal silicide layers 460 on the resistor dummy active areas 416 may reduce fabrication cost and fabrication complexity for fabrication sequences which do not include silicide block layers. Fabrication of the integrated circuit 400 is continued with formation of a pre-metal dielectric (PMD) layer over the metal silicide layers 460 and formation of contacts through the PMD layer to make electrical connections to the well resistor 410 through the metal silicide layers 460 and the resistor head contact regions 420.

Figure 5A:
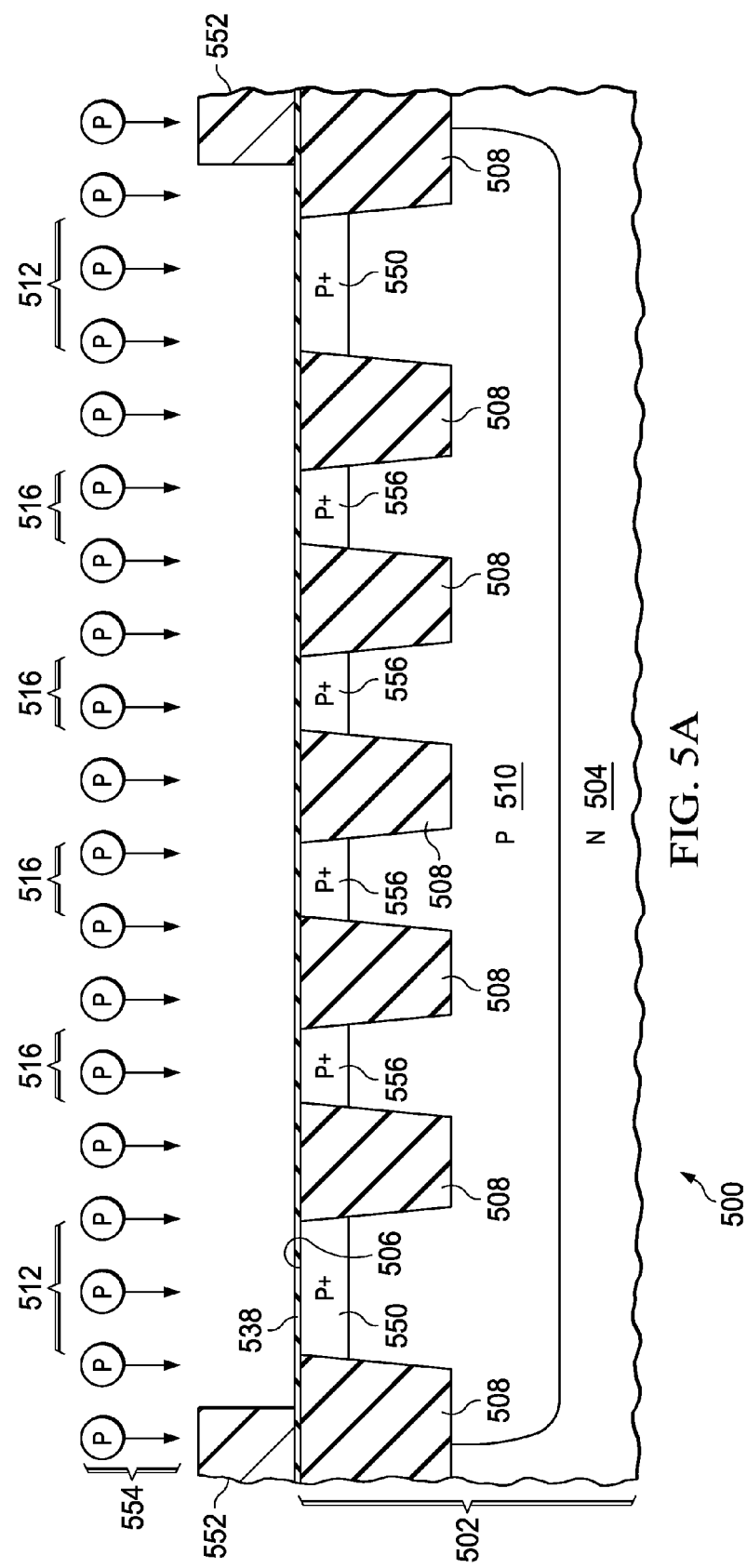
FIG. 5A through FIG. 5D are cross sections of another example integrated circuit containing a well resistor, depicted in successive stages of fabrication.

FIG. 5A through FIG. 5D are cross sections of another example integrated circuit containing a well resistor, depicted in successive stages of fabrication. Referring to FIG. 5A, the integrated circuit 500 is formed on a substrate 502 which includes semiconductor material 504 extending to a top surface 506 of the substrate 502. In the instant example, the semiconductor material 504 is n-type. Field oxide 508 is formed in the substrate 502 as described in reference to FIG. 4A through FIG. 4E. The integrated circuit 500 includes resistor head active areas 512 and resistor dummy active areas 516. A layer of pad oxide 538, corresponding to the second layer of pad oxide 438 of FIG. 4F, is formed over the substrate 502. A p-type well resistor 510 is formed in the semiconductor material 504 under the field oxide 508 as described in reference to FIG. 4F and FIG. 4G, with an appropriate change in the implanted dopants. A combined contact/dummy implant mask 552 is formed over an existing top surface of the integrated circuit 500 so as to expose the resistor head active areas 512 and resistor dummy active areas 516. The combined contact/dummy implant mask 552 may also expose areas for PSD regions in PMOS transistors in the integrated circuit 500, advantageously reducing fabrication cost and fabrication complexity of the integrated circuit 500. P-type dopants 554 such as boron are implanted as described in reference to FIG. 4I into the resistor head active areas 512 and resistor dummy active areas 516 to form contact implanted regions 550 in the resistor head active areas 512 and to form dummy implanted regions 556 in the resistor dummy active areas 516. The contact implanted regions 550 and the dummy implanted regions 556 may have properties similar to the dummy implanted regions 456 of FIG. 4I. The combined contact/dummy implant mask 552 is subsequently removed.

Figure 5B:
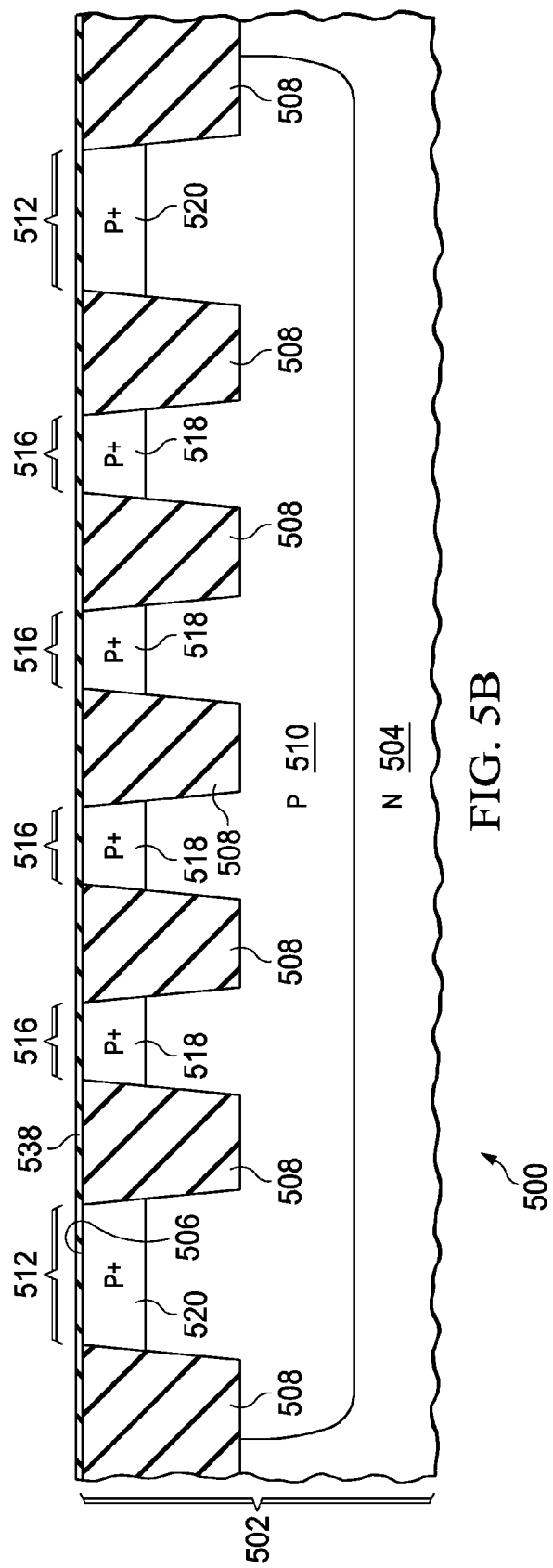

Referring to FIG. 5B, an anneal operation is performed which activates the implanted p-type dopants 554 of FIG. 5A in the contact implanted regions 550 to form p-type resistor head contact regions 520 in the resistor head active areas 512, and in the dummy implanted regions 556 to form p-type dummy diffused regions 518 in the resistor dummy active areas 516. The anneal operation may be performed as described in reference to FIG. 4J.

Figure 5C:
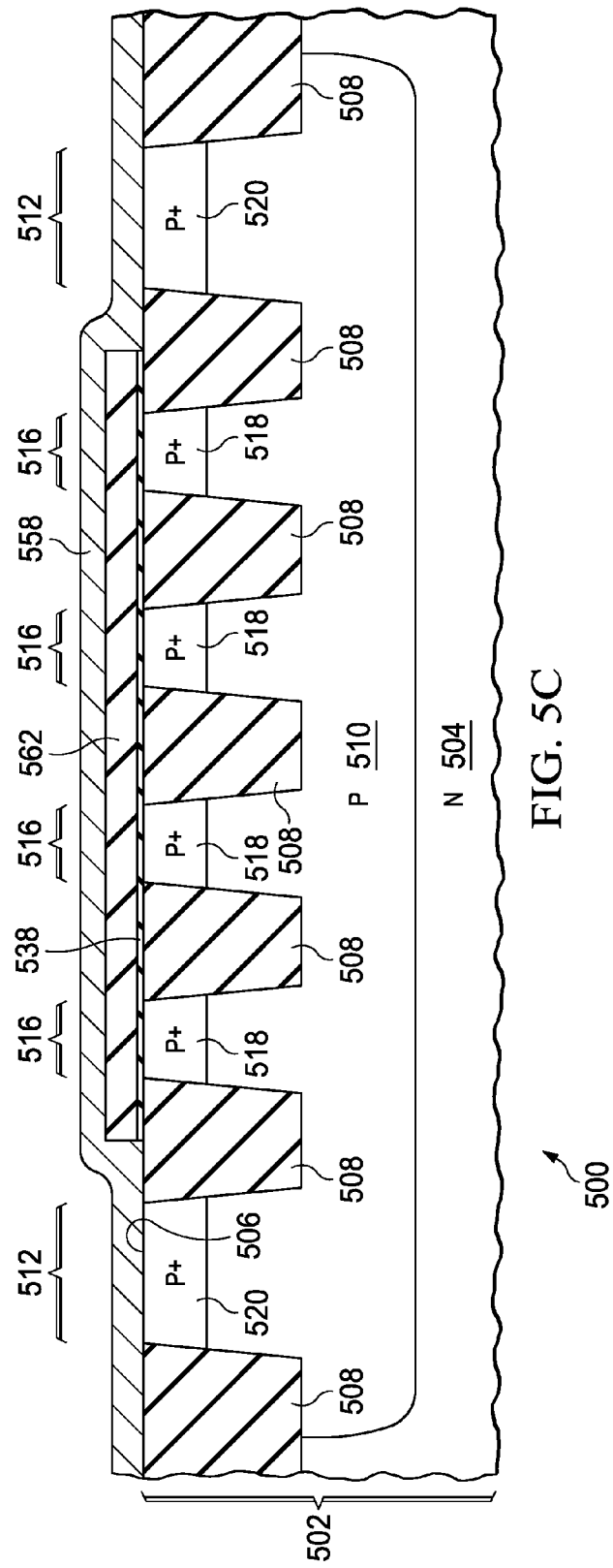

Referring to FIG. 5C, a silicide block layer 562 of dielectric material such as silicon nitride and/or silicon dioxide is formed over the layer of pad oxide 538. An etch mask is formed over the silicide block layer 562 and the layer of pad oxide 538 which exposes the resistor head active areas 512 and covers the resistor dummy active areas 516. An etch process removes the silicide block layer 562 and the layer of pad oxide 538 in areas exposed by the etch mask. The etch mask is subsequently removed. The resistor head active areas 512 are cleaned as described in reference to FIG. 4K while the resistor dummy active areas 516 are covered by the silicide block layer 562 and the layer of pad oxide 538. A layer of refractory metal 558 is formed on an existing top surface of the integrated circuit 500. The layer of refractory metal 558 is formed on the resistor head active areas 512, and is separated from the resistor dummy active areas 516 by the silicide block layer 562 and the layer of pad oxide 538. The layer of refractory metal 558 may have the composition and thickness described in reference to FIG. 4K.

Figure 5D:
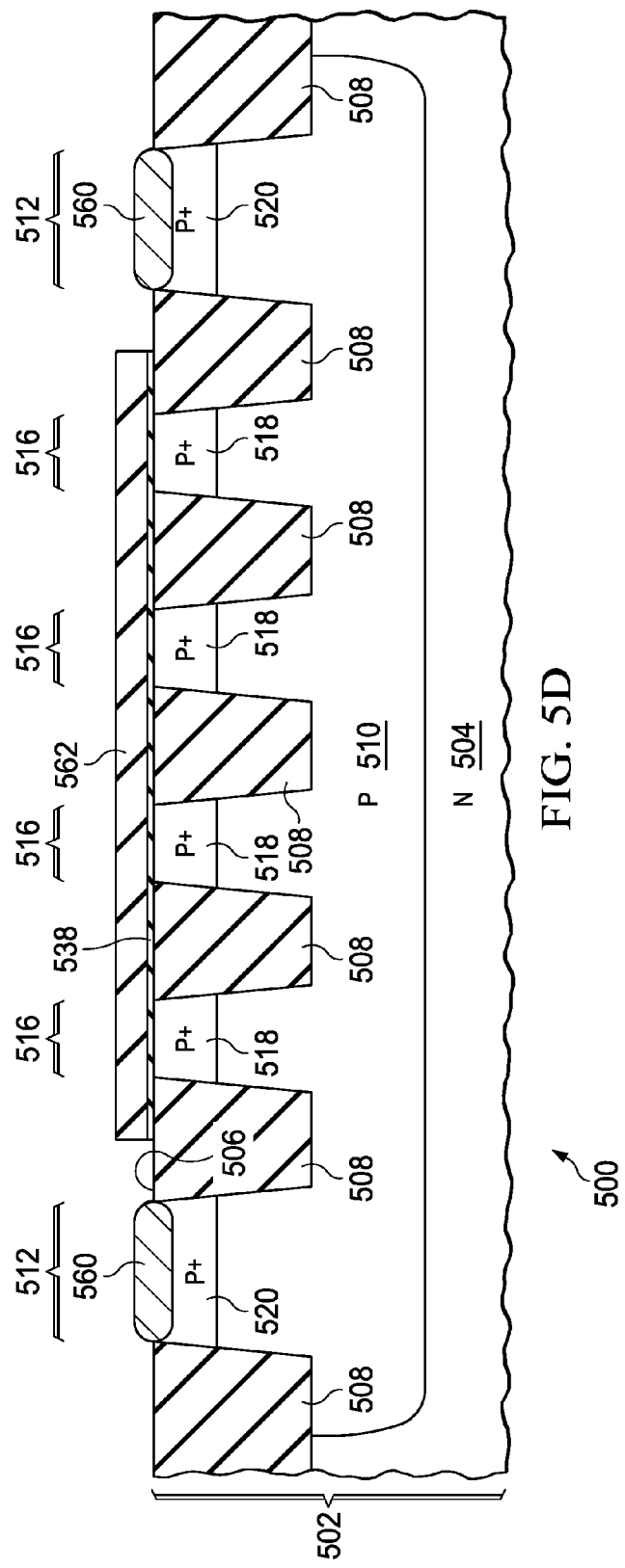

Referring to FIG. 5D, the substrate 502 is heated so that the refractory metal in the layer of refractory metal 558 of FIG. 5C reacts with silicon in the resistor head active areas 512 at the top surface 506 of the substrate 502 to form metal silicide layers 560 at tops of the resistor head active areas 512, as described in reference to FIG. 4L. Unreacted refractory metal in the layer of refractory metal 558 is subsequently removed. Fabrication of the integrated circuit 500 is continued with formation of a PMD layer and contacts to the well resistor 510 through the metal silicide layers 560 and the resistor head contact regions 520. Blocking metal silicide from forming on the resistor dummy active areas 516 may advantageously provide more uniform resistance values for instances of the well resistor 510 compared to instances with metal silicide on the resistor dummy active areas.

Figure 6A:
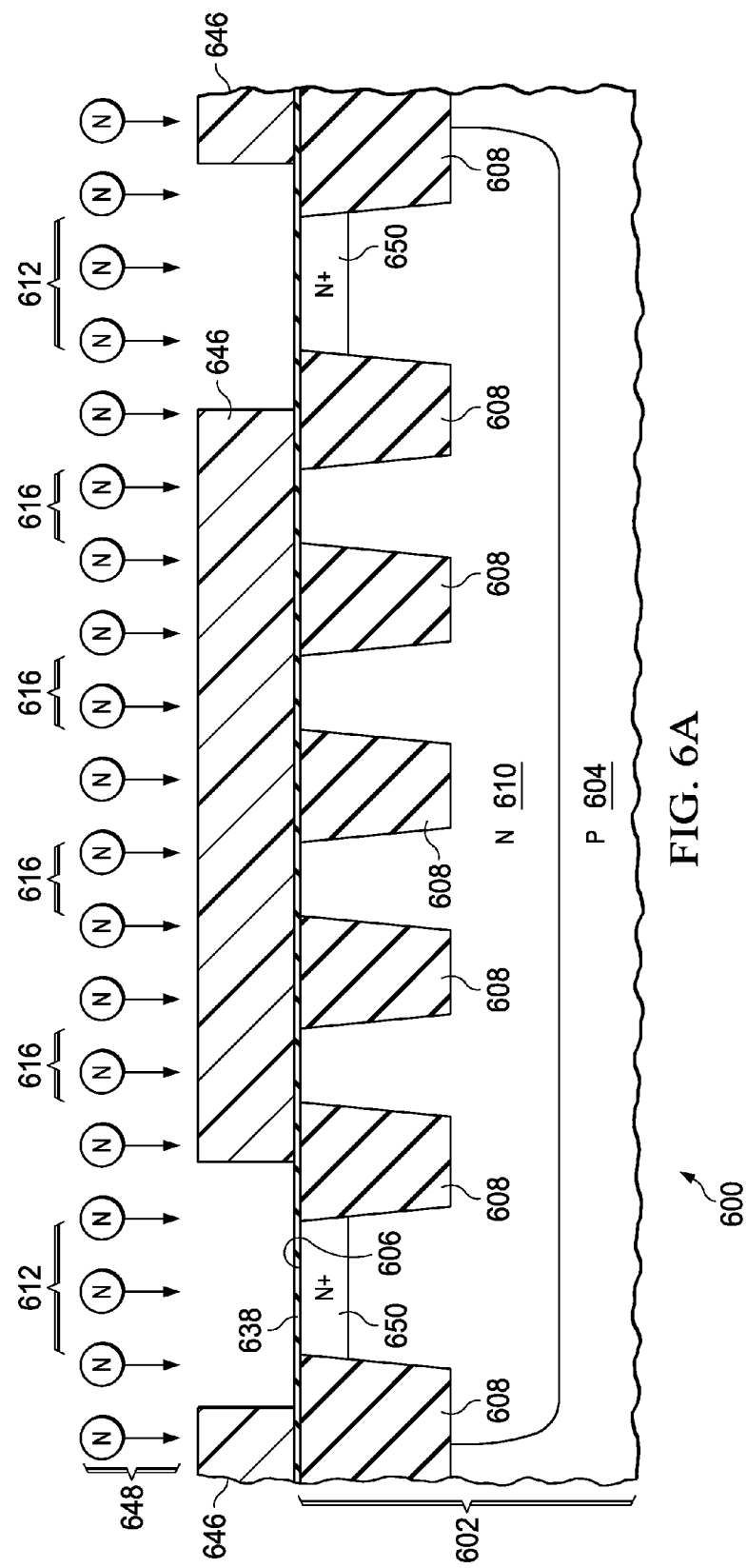
FIG. 6A through FIG. 6C are cross sections of a further example integrated circuit containing a well resistor, depicted in successive stages of fabrication.
Figure 6B:
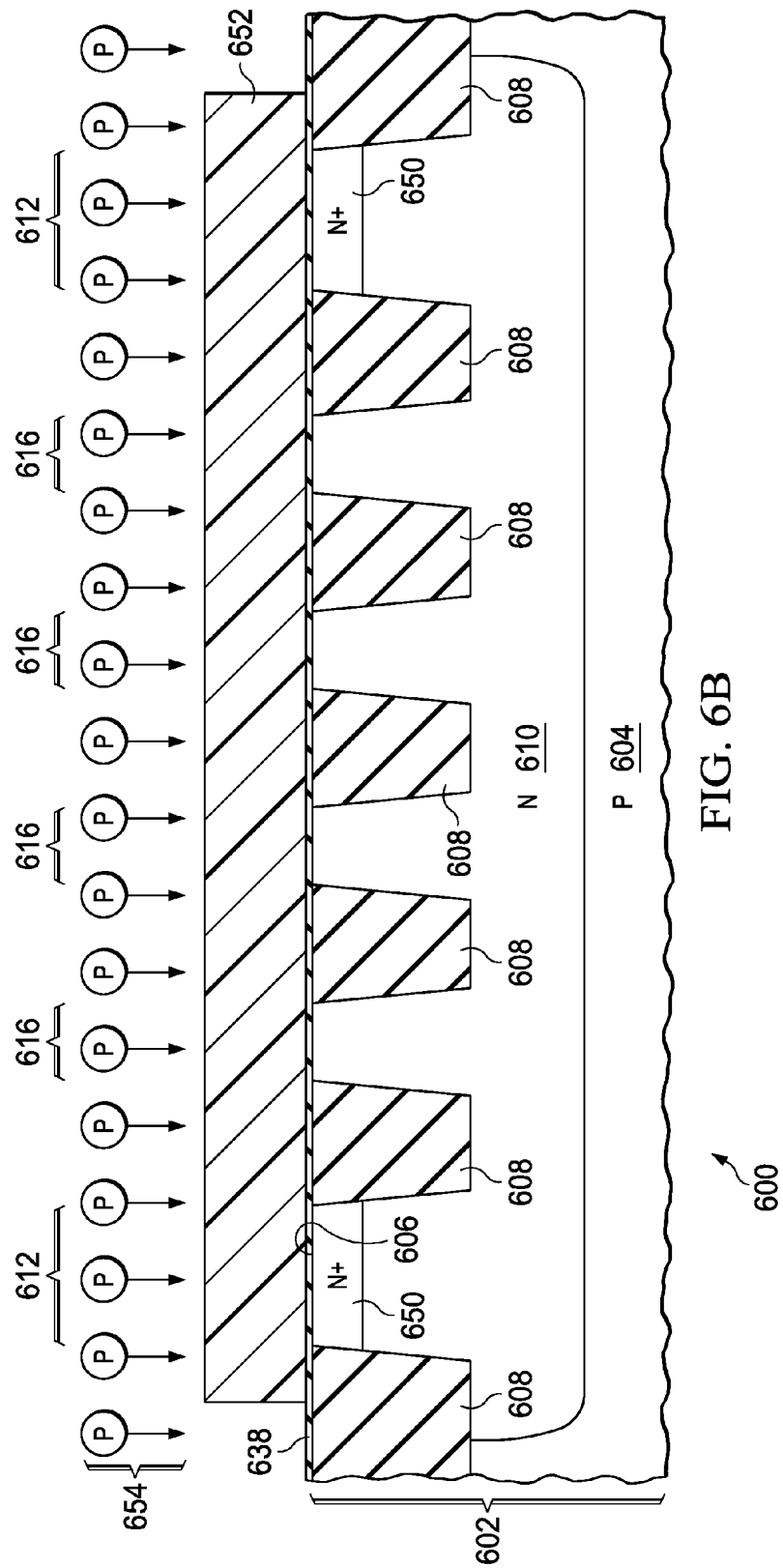
Figure 6C:
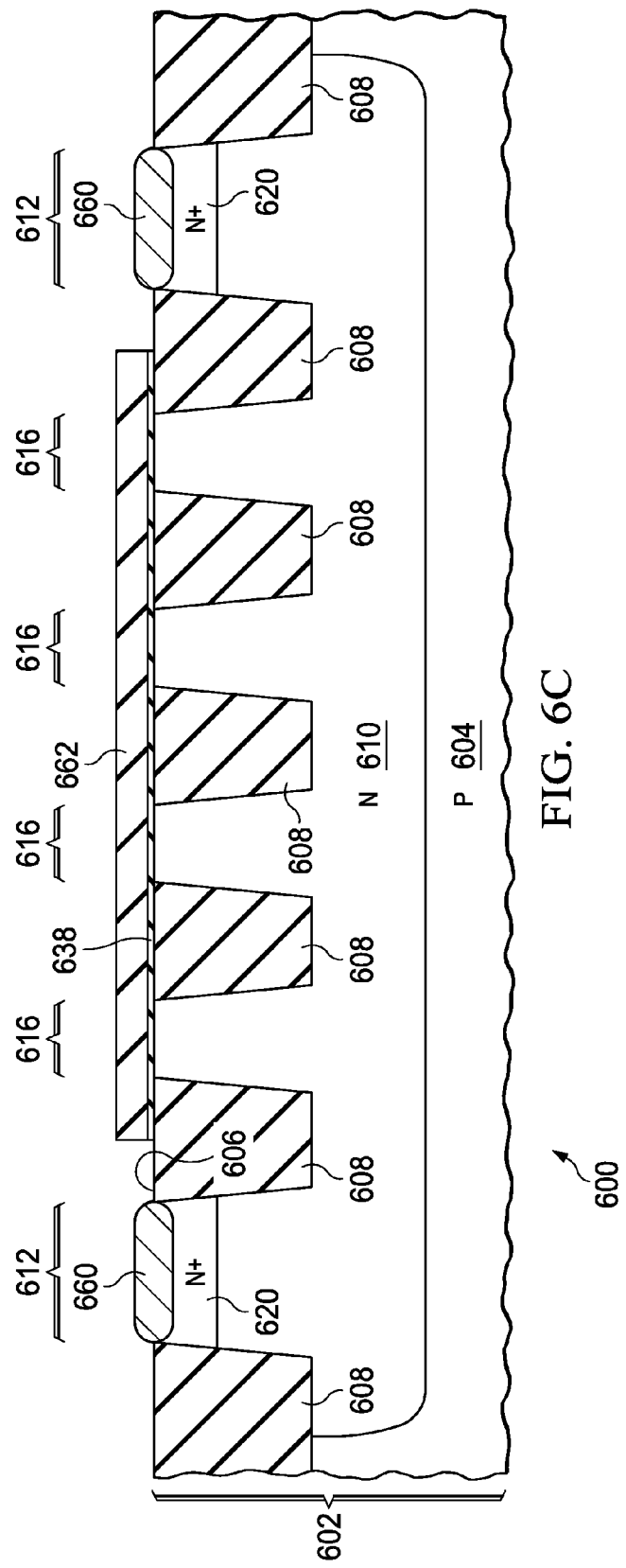

FIG. 6A through FIG. 6C are cross sections of a further example integrated circuit containing a well resistor, depicted in successive stages of fabrication. Referring to FIG. 6A, the integrated circuit 600 is formed on a substrate 602 which includes semiconductor material 604 extending to a top surface 606 of the substrate 602. In the instant example, the semiconductor material 604 is p-type. Field oxide 608 is formed in the substrate 602 as described in reference to FIG. 4A through FIG. 4E. The integrated circuit 600 includes resistor head active areas 612 and resistor dummy active areas 616. A layer of pad oxide 638, corresponding to the second layer of pad oxide 638 of FIG. 4F, is formed over the substrate 602. An n-type well resistor 610 is formed in the semiconductor material 604 under the field oxide 608 as described in reference to FIG. 4F and FIG. 4G. A contact implant mask 646 is formed over an existing top surface of the integrated circuit 600 so as to expose the resistor head active areas 612. In the instant example, the contact implant mask 646 covers the resistor dummy active areas 616. The contact implant mask 646 may also expose areas for NSD regions in NMOS transistors in the integrated circuit 600. N-type dopants 648 such as phosphorus and/or arsenic are implanted into the resistor head active areas 612 to form contact implanted regions 650 as described in reference to FIG. 4H. The contact implant mask 646 is subsequently removed.

Referring to FIG. 6B, a PSD mask 652 is formed over an existing top surface of the integrated circuit 600 so as to cover both the resistor head active areas 612 and the resistor dummy active areas 616. The PSD mask 652 exposes areas for PSD regions in PMOS transistors in the integrated circuit 600. P-type dopants 654 such as boron are implanted into the substrate 602 in areas exposed by the PSD mask 652. The resistor head active areas 612 and the resistor dummy active areas 616 are substantially free of the p-type dopants 654. The PSD mask 652 is subsequently removed. The resistor dummy active areas 616 are substantially free of doping other than that used to form the well resistor 610.

Referring to FIG. 6C, an anneal operation is performed which activates the implanted n-type dopants 648 of FIG. 6A in the contact implanted regions 650 to form n-type resistor head contact regions 620 in the resistor head active areas 612. A silicide block layer 662 is formed and patterned with the layer of pad oxide 638 over the substrate 602 so as to expose the resistor head active areas 612 and covers the resistor dummy active areas 616, as described in reference to FIG. 5C. Metal silicide layers 660 are formed at top surfaces of the resistor head active areas 612, as described in reference to FIG. 5C and FIG. 5D. Forming the well resistor 610 without extra doping in the resistor dummy active areas 616 may advantageously provide more uniform resistance values for instances of the well resistor 610 compared to instances with extra doping in the resistor dummy active areas.

Figure 7:
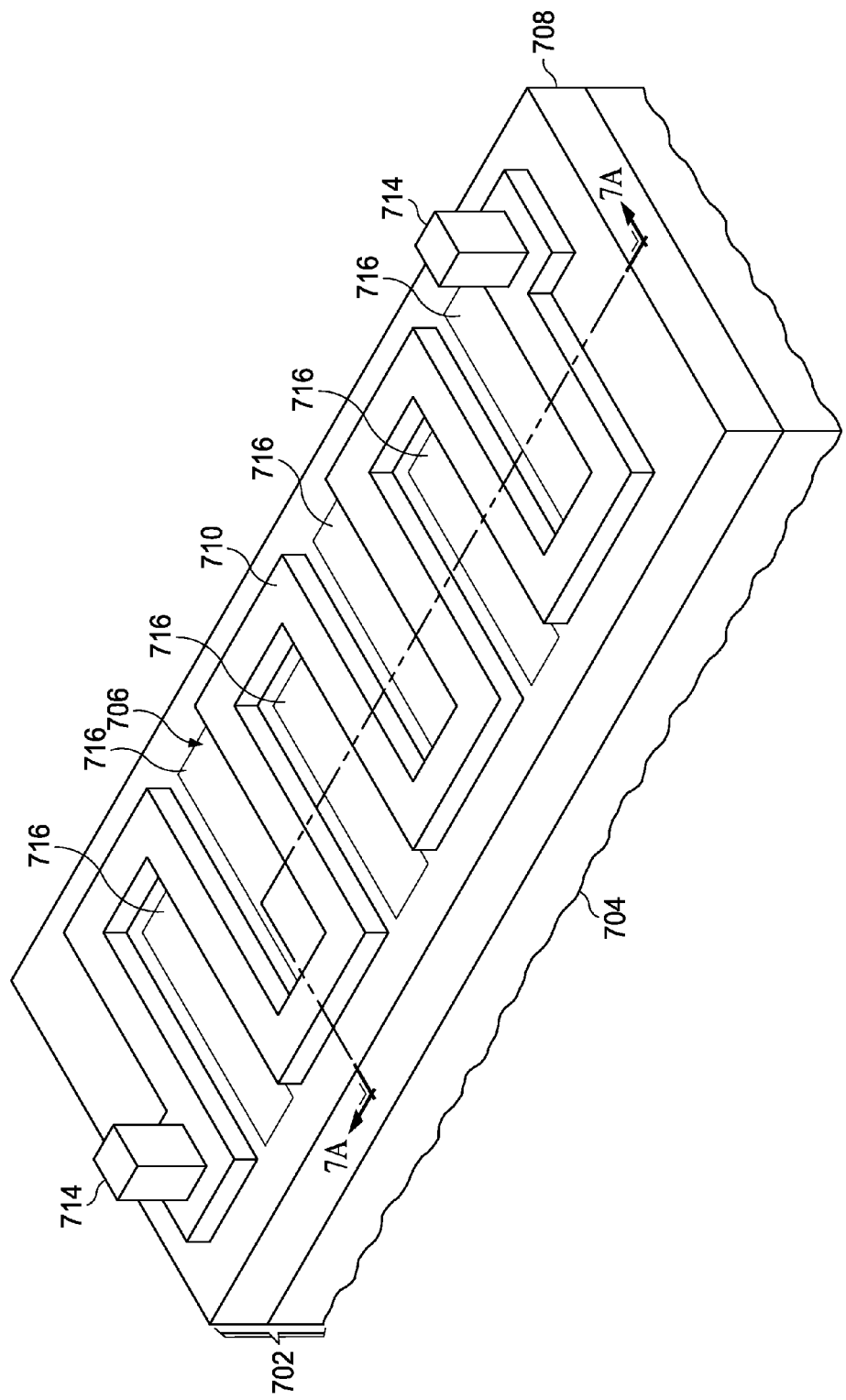
FIG. 7 depicts an example integrated circuit containing a polysilicon resistor.
Figure 7A:
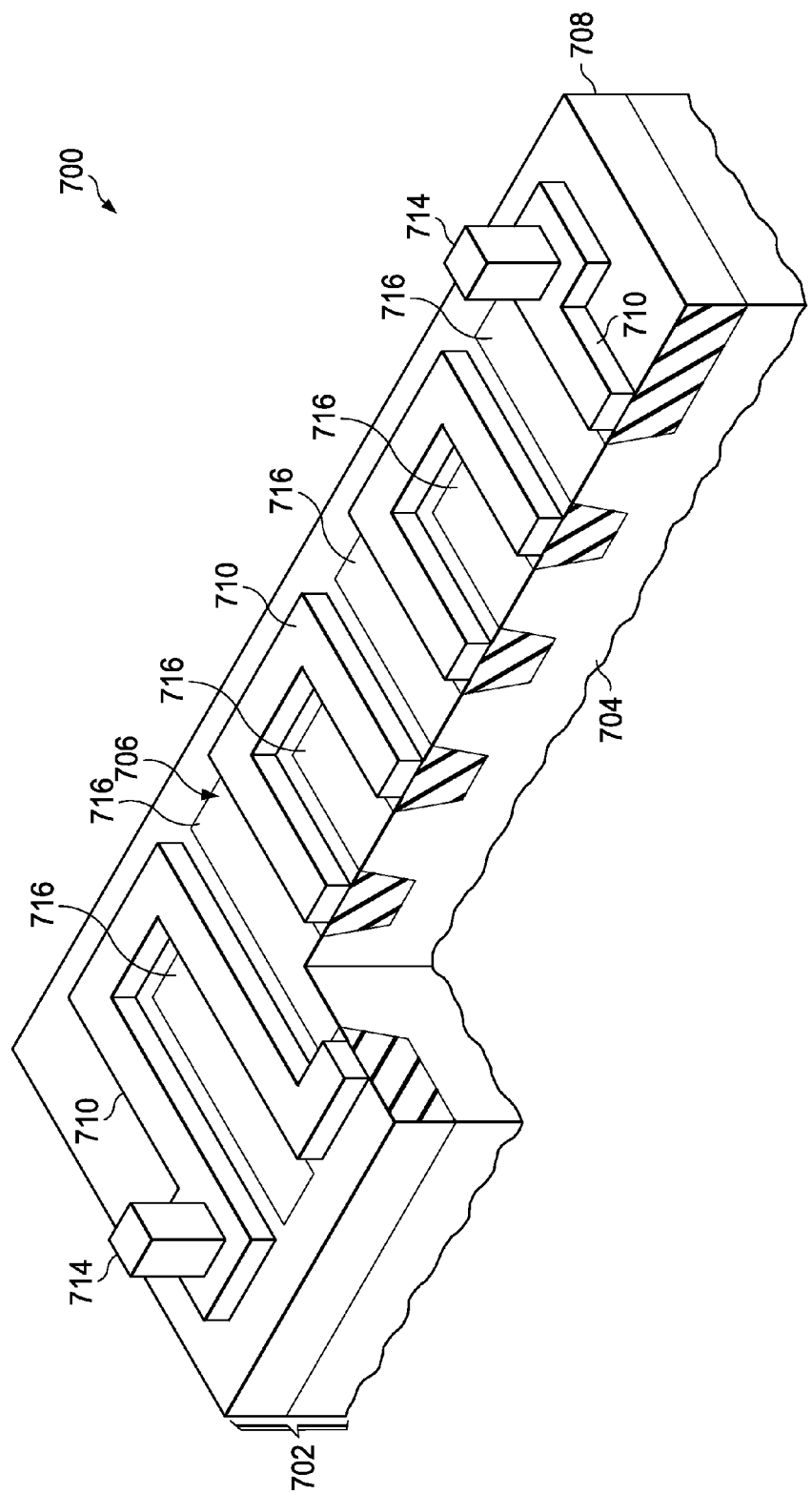
FIG. 7A is a cross section of the integrated circuit of FIG. 7.

FIG. 7 depicts an example integrated circuit containing a polysilicon resistor. The integrated circuit 700 is formed on a substrate 702 which includes semiconductor material 704 extending to a top surface 706 of the substrate 702. Field oxide 708 formed by an STI process is disposed at the top surface 706 of the substrate 702. The polysilicon resistor 710 is disposed over the field oxide 708. The polysilicon resistor 710 is formed from a layer of polysilicon that has been planarized by a CMP process. The field oxide 708 is formed so that resistor dummy active areas 716 are disposed through the field oxide 708 in an area for the polysilicon resistor 710. No electrical connections are made to the resistor dummy active areas 716 above the top surface 706 of the substrate 702. A density of the resistor dummy active areas 716 is 10 percent to 80 percent. Forming the resistor dummy active areas 716 in the area for the polysilicon resistor 710 with a density of 10 percent to 80 percent may prevent overpolishing the field oxide 708 during the STI process, advantageously providing a desired thickness of the planarized polysilicon in the polysilicon resistor 710, which provides a desired resistance for the polysilicon resistor 710. In one version of the instant example, the density of the resistor dummy active areas 716 is 20 percent to 50 percent, advantageously providing a thickness of the field oxide 708 closer to a desired thickness. In a further version, the density of the resistor dummy active areas 716 is 25 percent to 30 percent, advantageously narrowing the range for the thickness of the field oxide 708 even further. Contacts 714 are formed on the polysilicon resistor 710 to provide electrical connections to the polysilicon resistor 710. FIG. 7A is a cross section of the integrated circuit of FIG. 7, showing the resistor dummy active areas 716 more clearly.

Figure 9:
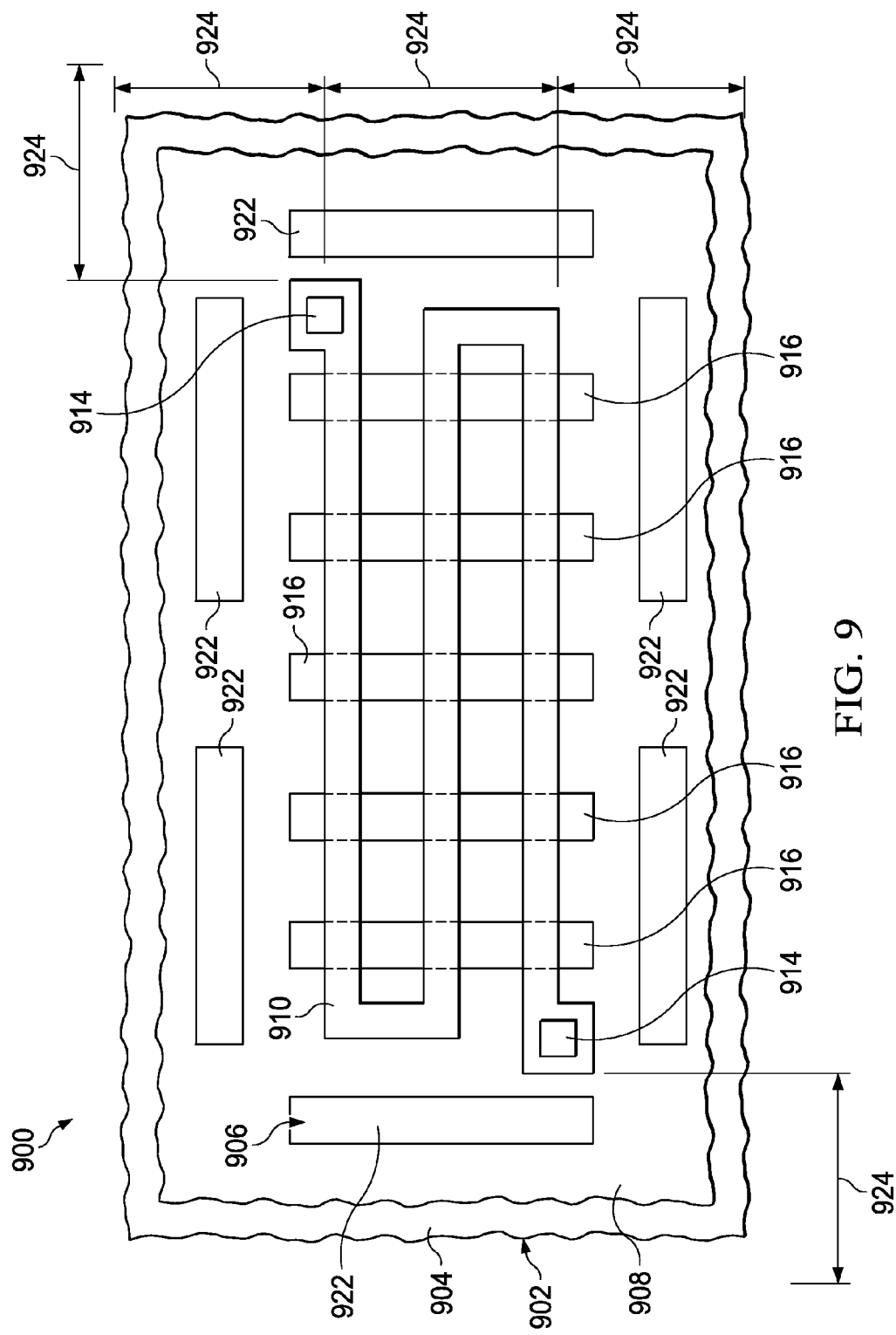

FIG. 8 and FIG. 9 are top views of example integrated circuits containing polysilicon resistors. Referring to FIG. 8, the integrated circuit 800 is formed on a substrate 802 which includes semiconductor material 804 extending to a top surface 806 of the substrate 802. Field oxide 808 formed by an STI process is disposed at the top surface 806 of the substrate 802. A polysilicon resistor 810 is formed from a CMP-planarized layer of polysilicon over the field oxide 808. Contacts 814 are formed to make electrical connections to the polysilicon resistor 810. The field oxide 808 is formed so that resistor dummy active areas 816 are disposed through the field oxide 808 in an area for the polysilicon resistor 810. In the instant example, the resistor dummy active areas 816 do not extend under the polysilicon resistor 810, which may advantageously reduce a capacitive load on the polysilicon resistor 810. An optional surrounding dummy active area 822 may be disposed through the field oxide 808 continuously surrounding the area for the polysilicon resistor 810. The surrounding dummy active area 822, if present, is within a width 824 of the polysilicon resistor 810. Forming the surrounding dummy active area 822 so as to continuously surround the polysilicon resistor 810 within the width 824 of the polysilicon resistor 810 may advantageously provide a tighter process range for the thickness of the field oxide 808 while reducing the density of the resistor dummy active areas 816. Reducing the density of the resistor dummy active areas 816 may be desirable for reducing an overall area of the polysilicon resistor 810.

Referring to FIG. 9, the integrated circuit 900 is formed on a substrate 902 which includes semiconductor material 904 extending to a top surface 906 of the substrate 902. Field oxide 908 formed by an STI process is disposed at the top surface 906 of the substrate 902. A polysilicon resistor 910 is formed from a CMP-planarized layer of polysilicon over the field oxide 908. Contacts 914 are formed to make electrical connections to the polysilicon resistor 910. The field oxide 908 is formed so that resistor dummy active areas 916 are disposed through the field oxide 908 in an area for the polysilicon resistor 910. In the instant example, the resistor dummy active areas 916 extend under the polysilicon resistor 910, which may increase a density of the resistor dummy active areas 916 and thus advantageously reduce overpolishing of the field oxide 908. Optional surrounding dummy active areas 922 may be disposed through the field oxide 908 around the area for the polysilicon resistor 910. The surrounding dummy active areas 922 may be segmented, as shown in FIG. 9. The surrounding dummy active areas 922, if present, are within a width 924 of the polysilicon resistor 910.

Figure 10A:
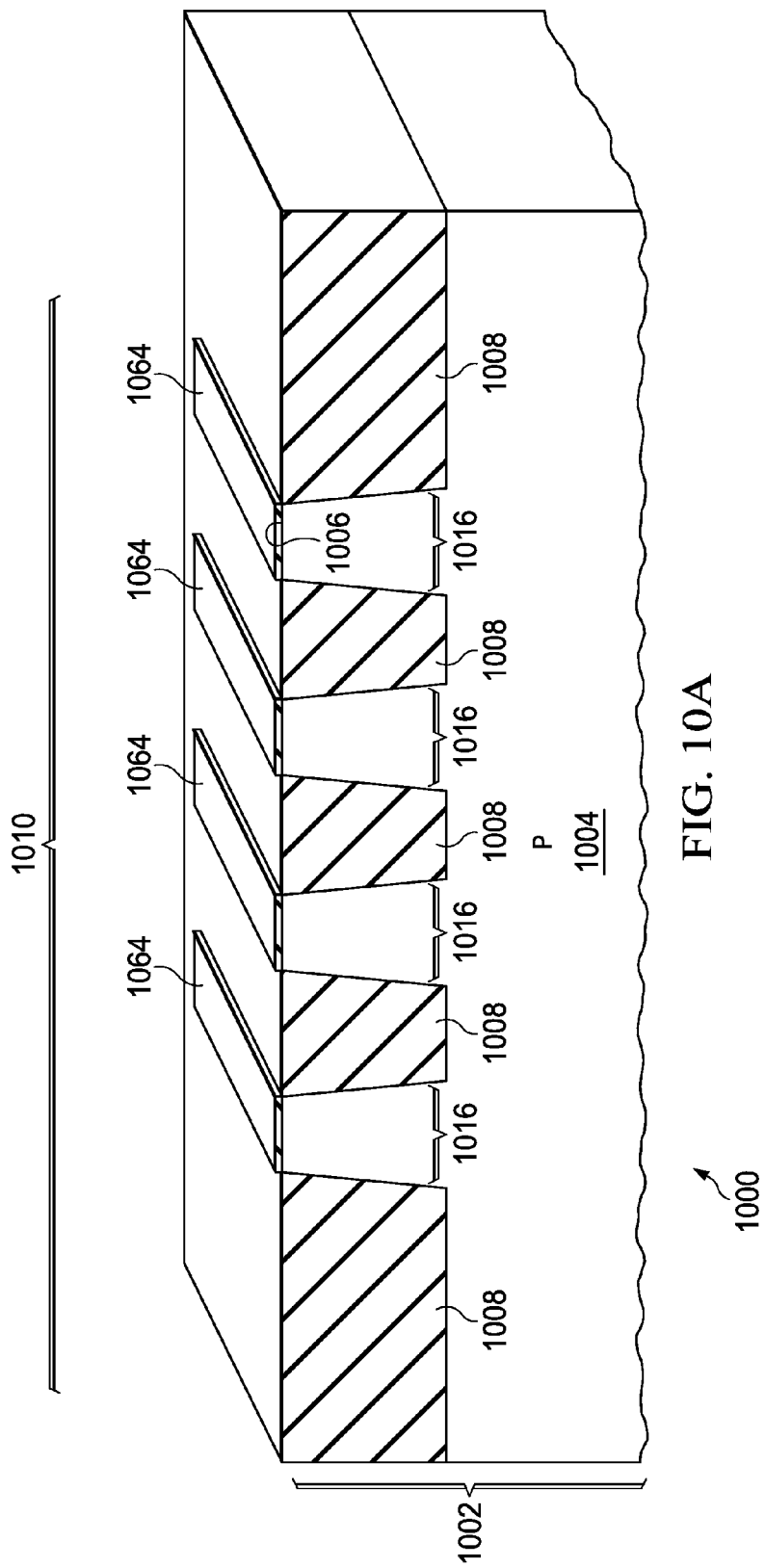
FIG. 10A through FIG. 10F are cross sections of an example integrated circuit containing a polysilicon resistor, depicted in successive stages of fabrication.

FIG. 10A through FIG. 10F are cross sections of an example integrated circuit containing a polysilicon resistor, depicted in successive stages of fabrication. Referring to FIG. 10A, the integrated circuit 1000 is formed on a substrate 1002 which includes semiconductor material 1004 extending to a top surface 1006 of the substrate 1002. In the instant example, the semiconductor material 1004 is p-type. Field oxide 1008 is formed by an STI process at the top surface 1006 of the substrate 1002, as described in reference to FIG. 4A through FIG. 4E. The field oxide 1008 is formed so that resistor dummy active areas 1016 are disposed through the field oxide 1008 in an area for the polysilicon resistor 1010. A dielectric layer 1064 is disposed over the resistor dummy active areas 1016. The dielectric layer 1064 may possibly be formed concurrently with gate dielectric layers of NMOS and PMOS transistors of the integrated circuit. The dielectric layer may possibly extend over the field oxide 1008.

Figure 10B:
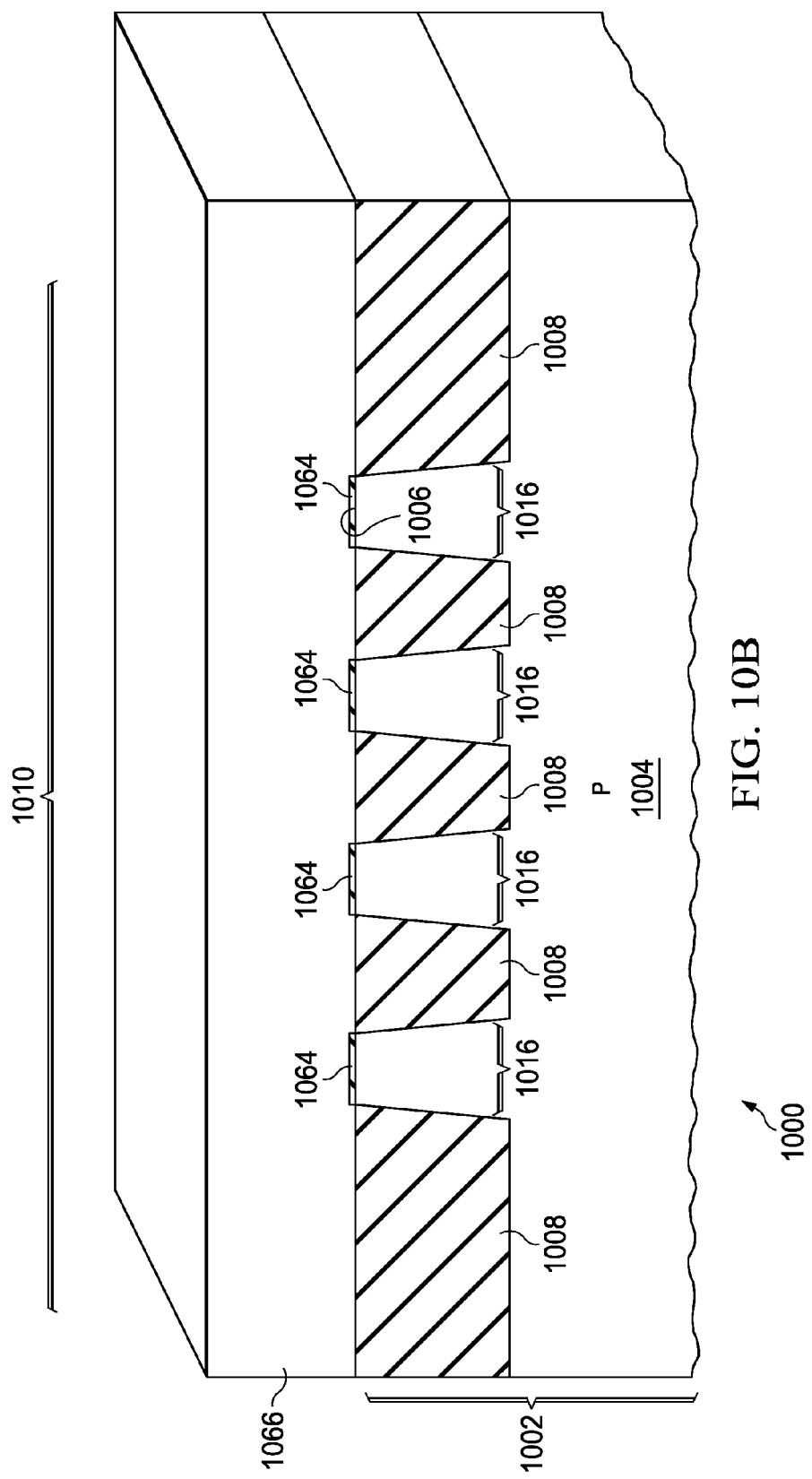

Referring to FIG. 10B, a layer of polysilicon 1066 is formed over the field oxide 1008 and the dielectric layer 1064. The layer of polysilicon 1066 may be formed by a conformal process, for example by pyrolyzing silane at 580° C. to 650° C. The layer of polysilicon 1066 may be doped in situ during formation by including dopant gases, such as phosphine, arsine, or boron trichloride, with the silane. Alternatively, the layer of polysilicon 1066 may be doped after formation by ion implantation. In situ doping may produce a constant average doping density, independent of a thickness of the layer of polysilicon 1066. Ion implantation may produce a constant total dose of dopants in the layer of polysilicon 1066, independent of the thickness.

Figure 10C:
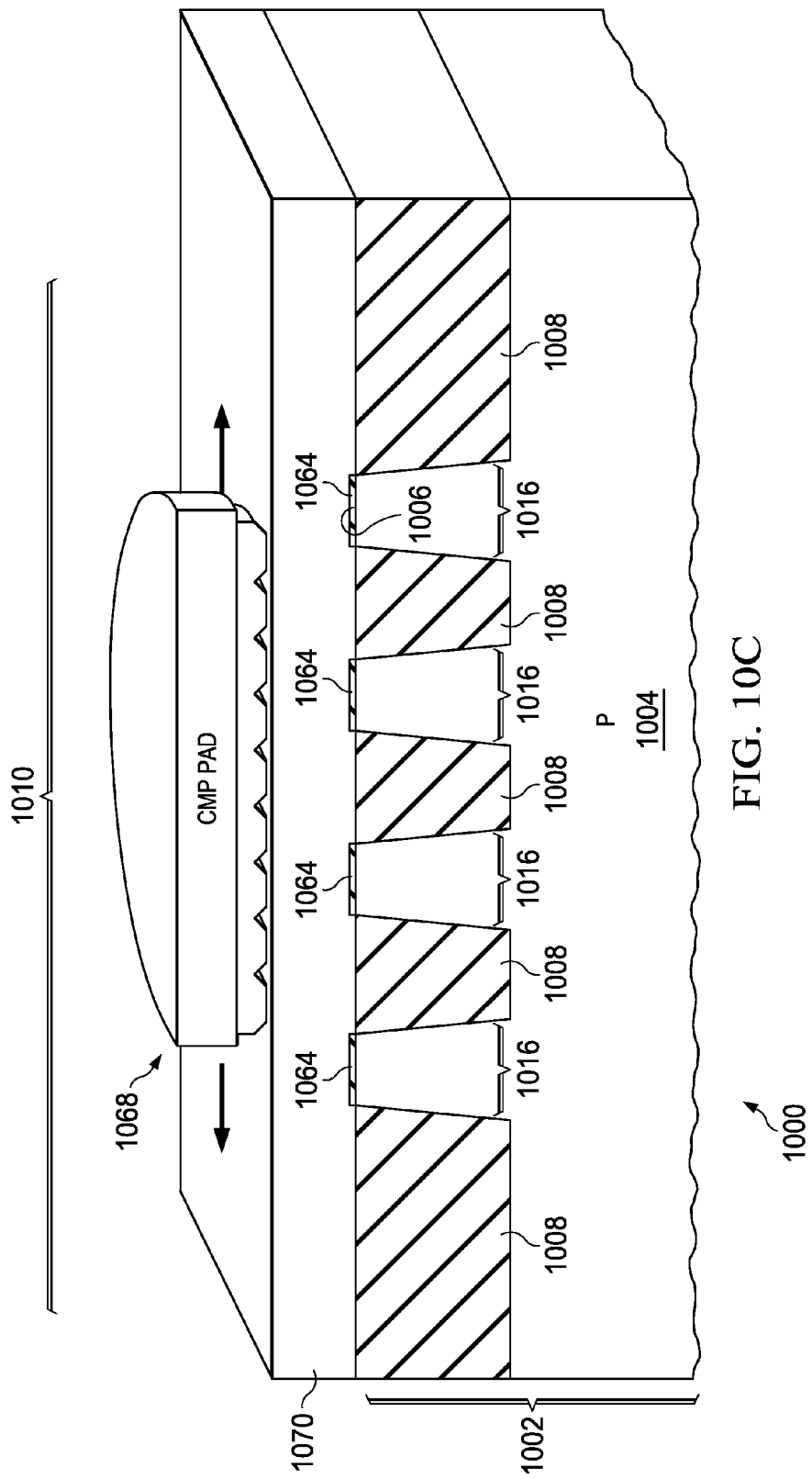

Referring to FIG. 10C, the layer of polysilicon 1066 of FIG. 10B is planarized by a CMP process 1068, depicted schematically in FIG. 10C by a CMP Pad 1068, to form a CMP-planarized polysilicon layer 1070 with a desired thickness. The CMP process 1068 may be used, for example, to remove any surface topology from the layer of polysilicon 1066 due to the conformal nature of the polysilicon formation process. Forming the field oxide 1008 with the resistor dummy active areas 1016 in the area for the polysilicon resistor 1010 provides a desired thickness for the field oxide 1008 by reducing overpolishing during the STI process, which in turn advantageously provides a desired thickness for the CMP-planarized polysilicon layer 1070. Overpolished field oxide would produce a thinner field oxide, which would then undesirably produce a thicker CMP-planarized polysilicon layer.

Figure 10D:
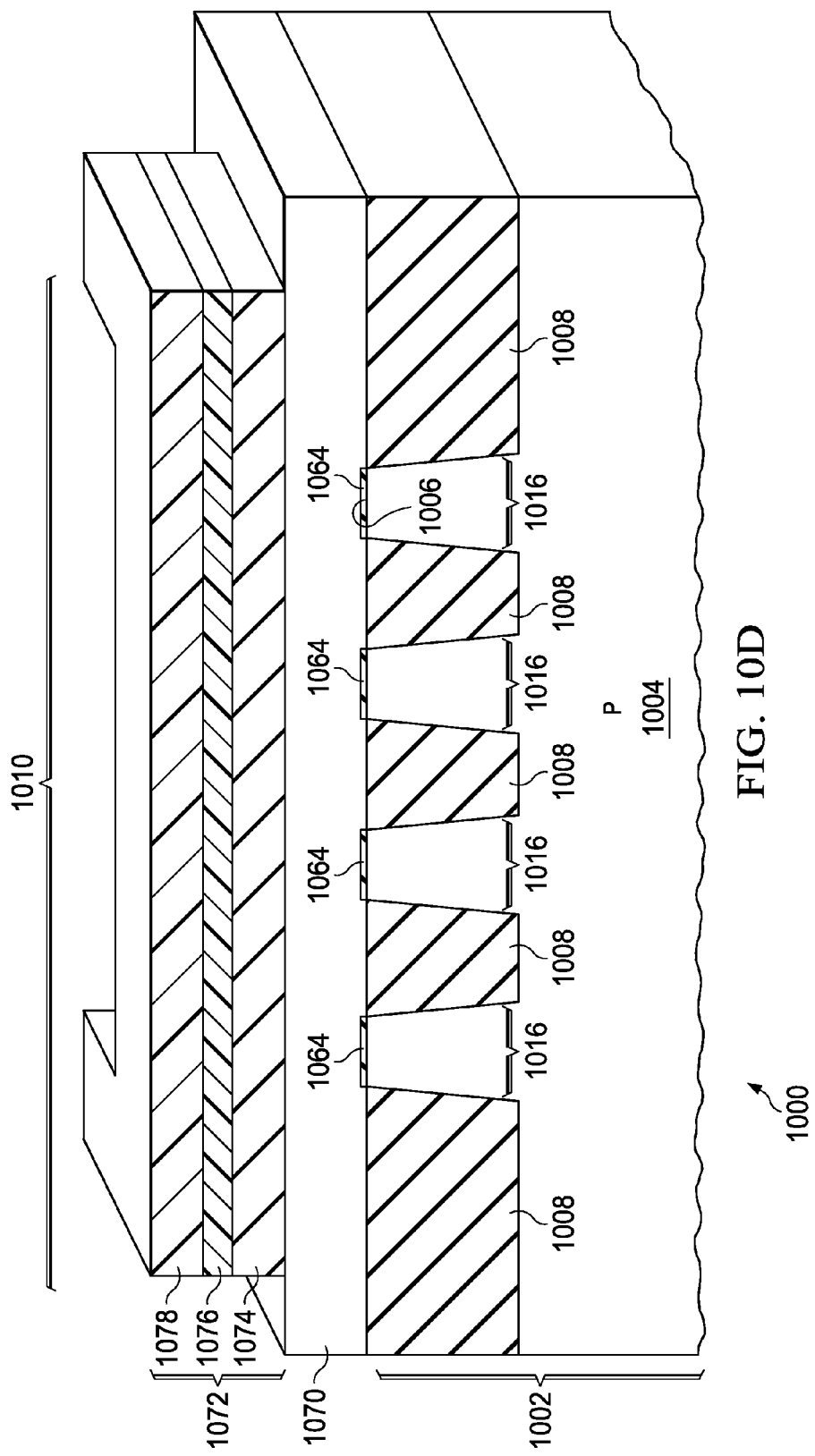

Referring to FIG. 10D, a polysilicon etch mask 1072 is formed over the CMP-planarized polysilicon layer 1070 so as to define the polysilicon resistor 1010. The polysilicon etch mask 1072 may also cover areas for gates of NMOS and PMOS transistors in the integrated circuit 1000. The polysilicon etch mask 1072 may include a hard mask layer 1074 of silicon nitride or amorphous carbon, an anti-reflection layer 1076 of spin-coated organic material referred to as a bottom anti-reflection coat (BARC), and/or a photoresist layer 1078 formed by a photolithographic process.

Figure 10E:
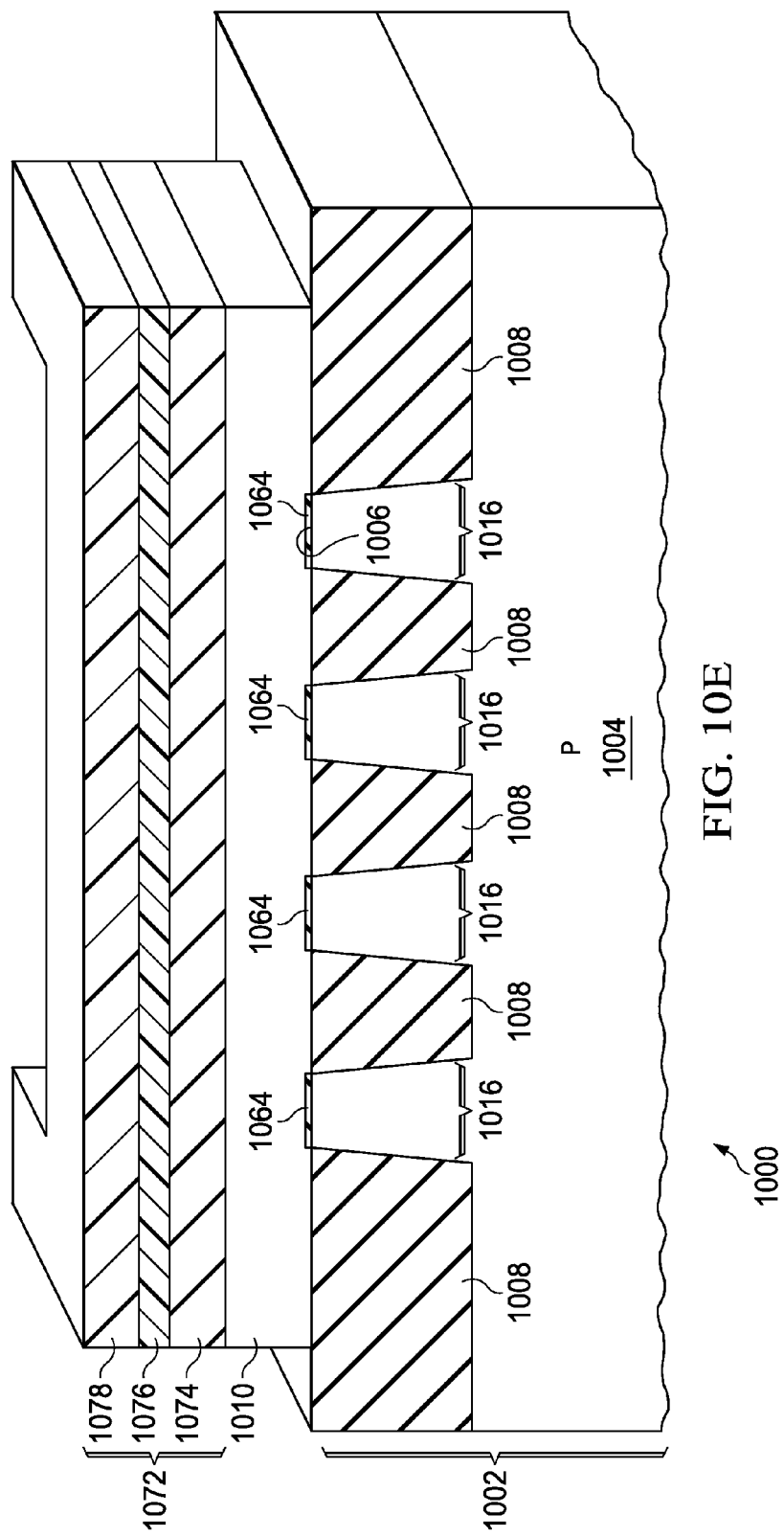

Referring to FIG. 10E, a polysilicon etch process removes polysilicon from the CMP-planarized polysilicon layer 1070 in areas exposed by the polysilicon etch mask 1072 to form the polysilicon resistor 1010. A portion or all of the photoresist layer 1078 and the anti-reflection layer 1076 may possibly be removed during the polysilicon etch process. Any remaining portion of the polysilicon etch mask 1072 is subsequently removed.

Figure 10F:
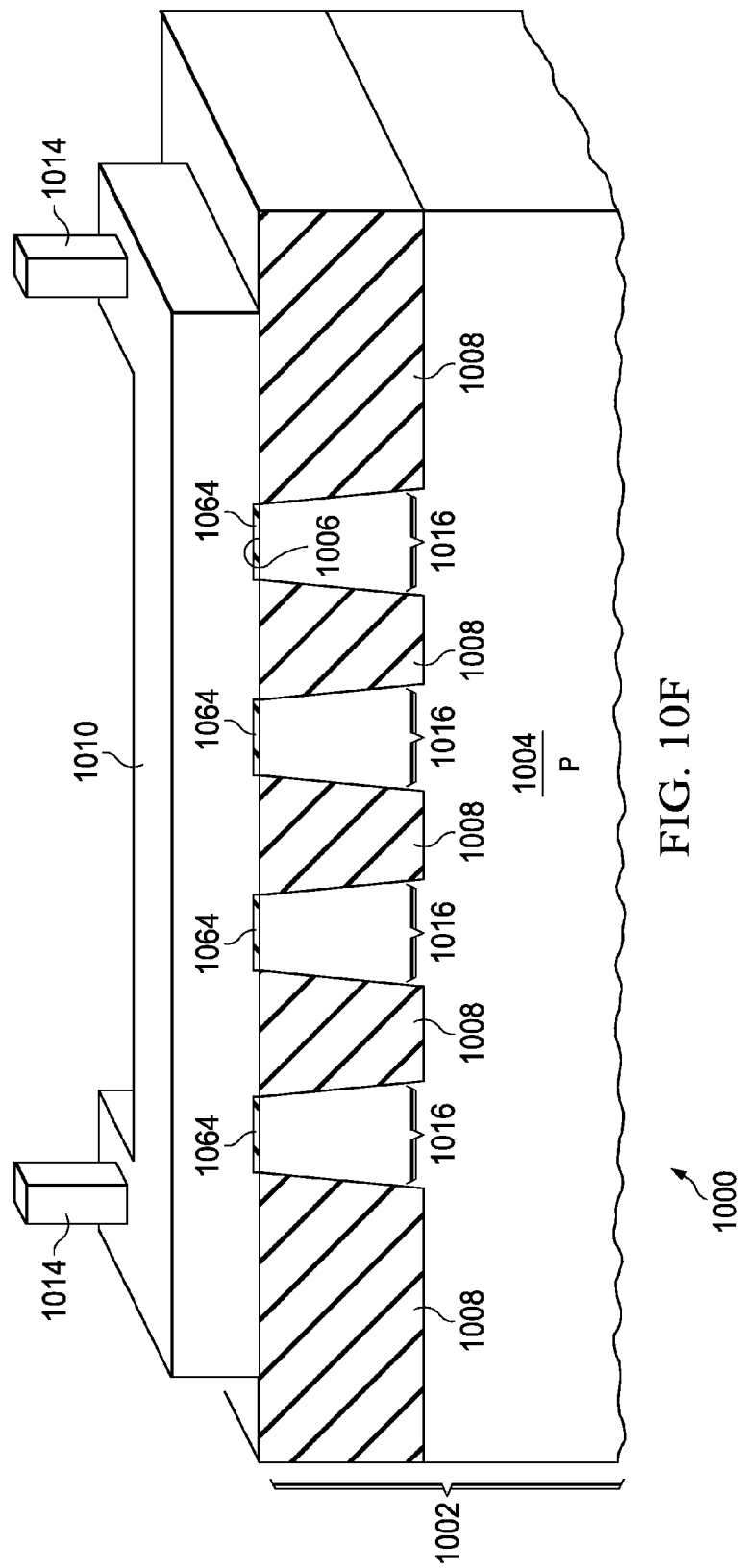

Referring to FIG. 10F, contacts 1014 are formed on the polysilicon resistor 1010 to make electrical connections to the polysilicon resistor. Metal silicide, not shown in FIG. 10F, may be formed on areas on the polysilicon resistor 1010 under the contacts 1014 to improve the electrical connections to the polysilicon resistor 1010.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps:
   providing a substrate comprising semiconductor material at a top surface of the substrate;
   forming a chemical mechanical polish (CMP) stop layer over the substrate;
   forming an STI mask over the CMP stop layer, the STI mask covering areas for active areas of the integrated circuit, the active areas including resistor head active areas in an area for a well resistor and including resistor dummy active areas in the area for the well resistor, the resistor dummy active areas having a density of 10 percent to 80 percent;
   removing the CMP stop layer and removing a portion of the semiconductor material of the substrate in areas exposed by the STI mask to form STI trenches 250 nanometers to 500 nanometers deep in the substrate;
   forming a layer of trench fill dielectric material in the STI trenches and over the CMP stop layer over the active areas, the trench fill dielectric material filling the STI trenches;
   planarizing the trench fill dielectric material down to the CMP stop layer by a CMP process, wherein the CMP process removes all of the trench fill dielectric material from over the CMP stop layer and does not remove any of the semiconductor material from the resistor head active areas and the resistor dummy active areas;
   removing a remaining portion of the CMP stop layer wherein the trench fill dielectric material in the STI trenches forms field oxide of the integrated circuit;
   implanting well dopants through the field oxide into the semiconductor material of the substrate under the field oxide in the area for the well resistor;
   heating the substrate in a well anneal process to activate the well dopants to form the well resistor; and
   forming contacts to provide electrical connections to the well resistor through the resistor head active areas, wherein the resistor dummy active areas are free of electrical connections above the substrate.

2. The method of claim 1, wherein the resistor dummy active areas have a density of 20 percent to 50 percent.

3. The method of claim 1, further comprising the steps:
   forming a dummy region implant mask over the substrate and the field oxide so as to expose the resistor dummy active areas;
   implanting source/drain dopants into the resistor dummy active areas while the dummy region implant mask is in place;
   subsequently removing the dummy region implant mask; and
   performing an anneal operation to activate the source/drain dopants to form heavily doped dummy diffused regions in the resistor dummy active areas, the heavily doped dummy diffused regions having an average doping density at least ten times an average doping density in the well resistor.

4. The method of claim 3, wherein the heavily doped dummy diffused regions have a same conductivity type as the well resistor.

5. The method of claim 1, further comprising the steps:
   forming a layer of refractory metal on top surfaces of the resistor head active areas and the resistor dummy active areas;
   heating the substrate to form layers of metal silicide at the top surfaces of the resistor head active areas and the resistor dummy active areas; and
   subsequently removing unreacted refractory metal from the layer of refractory metal.

6. The method of claim 1, wherein the resistor dummy active areas are configured as a plurality of rectangles such that each the rectangle extends from proximate to one side of the well resistor to proximate to an opposite side of the well resistor.

7. A method of forming an integrated circuit, comprising the steps:
   providing a substrate comprising semiconductor material at a top surface of the substrate;
   forming a CMP stop layer over the substrate;
   forming an STI mask over the CMP stop layer, the STI mask covering areas for active areas of the integrated circuit, the active areas including resistor dummy active areas in the area for a polysilicon resistor, the resistor dummy active areas having a density of 10 percent to 80 percent;

removing the CMP stop layer and removing a portion of the semiconductor material of the substrate in areas exposed by the STI mask to form STI trenches 250 nanometers to 500 nanometers deep in the substrate;

forming a layer of trench fill dielectric material in the STI trenches and over the CMP stop layer over the active areas, the trench fill dielectric material filling the STI trenches;

planarizing the trench fill dielectric material down to the CMP stop layer by a CMP process, wherein the CMP process removes all of the trench fill dielectric material from over the CMP stop layer and does not remove any of the semiconductor material from the resistor dummy active areas;

removing a remaining portion of the CMP stop layer wherein the trench fill dielectric material in the STI trenches forms field oxide of the integrated circuit;

forming a layer of polysilicon over the field oxide and the resistor dummy active areas;

planarizing the layer of polysilicon using a CMP process to form a CMP-planarized polysilicon layer;

forming a polysilicon etch mask over the CMP-planarized polysilicon layer which defines the polysilicon resistor;

removing polysilicon from the CMP-planarized polysilicon layer in areas outside the polysilicon etch mask to form the polysilicon resistor; and forming contacts to provide electrical connections to the polysilicon resistor, wherein the resistor dummy active areas are free of electrical connections above the substrate.

8. The method of claim 7, wherein the resistor dummy active areas do not extend under the polysilicon resistor.

9. The method of claim 7, wherein the resistor dummy active areas extend under the polysilicon resistor, being separated from the polysilicon resistor by a dielectric layer at top surfaces of the resistor dummy active areas.

10. The method of claim 7, wherein the resistor dummy active areas have a density of 20 percent to 50 percent.

* * * * *